(12) United States Patent
Nikaido et al.

(10) Patent No.: US 7,748,991 B2
(45) Date of Patent: Jul. 6, 2010

(54) IC SOCKET AND MANUFACTURING METHOD FOR THE SAME

(75) Inventors: Shinichi Nikaido, Sakura (JP); Haruo Miyazawa, Yotsukaido (JP); Katsuya Yamagami, Narashino (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 11/781,018

(22) Filed: Jul. 20, 2007

(65) Prior Publication Data
US 2008/0020624 A1  Jan. 24, 2008

(30) Foreign Application Priority Data

| Jul. 21, 2006 | (JP) | ............................. 2006-199844 |
| Jul. 21, 2006 | (JP) | ............................. 2006-199847 |

(51) Int. Cl.
*H01R 12/00* (2006.01)

(52) U.S. Cl. ....................................................... 439/71

(58) Field of Classification Search .................. 439/71, 439/73, 66, 68, 342, 86
See application file for complete search history.

(56) References Cited

U.S. PATENT DOCUMENTS

| 6,669,490 | B1 | 12/2003 | DelPrete et al. |
| 7,331,796 | B2 * | 2/2008 | Hougham et al. ............. 439/66 |
| 7,338,294 | B2 * | 3/2008 | Polnyi ......................... 439/66 |
| 7,393,214 | B2 * | 7/2008 | DiStefano ..................... 439/66 |

FOREIGN PATENT DOCUMENTS

| JP | 2000-91048 A | 3/2000 |
| JP | 2004-158430 A | 3/2004 |
| JP | 2005-019284 A | 1/2005 |

* cited by examiner

*Primary Examiner*—Alexander Gilman
(74) *Attorney, Agent, or Firm*—Sughrue Mion, PLLC

(57) ABSTRACT

An aspect of the present invention inheres in an IC socket includes a plate-like socket base body which includes through hole forming portions having a plurality of contact housing holes formed so as to penetrate the plate-like socket base in a front-to-back direction, and having through holes formed around the respective contact housing holes so as to penetrate the plate-like socket base in the front-to-back direction, and a plated layer formed continuously on an inner wall of the through hole, on the front and back surfaces of the through hole forming portion, and on a surface of the contact piece.

18 Claims, 22 Drawing Sheets

IC SOCKET AND MANUFACTURING METHOD FOR THE SAME

CROSS REFERENCE TO RELATED APPLICATIONS

This application is based upon and claims the benefit of priority from the prior Japanese Patent Application No. P2006-199844 and P2006-199847, filed on Jul. 21, 2006; the entire contents of which are incorporated herein by reference.

BACKGROUND OF THE INVENTION

1. Field of the Invention

The present invention relates to an integrated circuit (IC) socket used for mounting an IC package such as a central processing unit (CPU) or a large scale integrated circuit (LSI) onto a printed circuit. More specifically, the present invention relates to an IC socket including a three-dimensional circuit formed by use of a three-dimensional circuit forming technique, and to a manufacturing method thereof.

2. Description of the Related Art

Techniques for mounting an IC package such as a central processing unit (CPU) or a large scale integrated circuit (LSI) onto a printed circuit with a socket have long been studied. IC sockets for mounting CPUs in land grid array (LGA) packages or ball grid array (BGA) packages are embedded in many personal computers and mother boards of servers.

To improve functions and performances of CPUs, the number of pins and the processing speed have been increasing. With the increase in the number of pins and the processing speed of CPUs, IC packages have been improved to have a larger size and finer pitch and IC sockets have been also improved similarly, in order to support such CPUs having an increased number of pins. The increase in size of an IC package for supporting the increased number of pins increases the flexible volume of the IC package and variations in the height of contact lands and balls thereof.

Accordingly, an IC socket also needs to correspond to these increases, and is required to have a structure capable of securing contact strokes of the IC socket. Meanwhile, support for the finer pitch should be achieved with the simplest structure possible, and a desirable structure is one in which an IC package is connected to a printed circuit board at a short distance. Moreover, for the increase in the speed of a CPU, it is important that a contact between the IC socket and the package has low inductance. Here, it is also expected to achieve a high allowable current in response to an increase in a consumption current attributable to the higher speed.

The mainstream of a socket for a LGA package today is one corresponding to 400 to 800 pins at a pitch of about 1 mm with a structure in which given shapes of contacts are formed by intricately bending a metal plate, so that the contacts are inserted into a housing of the IC socket. However, these IC sockets are assembled by inserting the contacts one by one into the socket housings. Therefore, contact inserting time required for manufacturing is increased along with the increase in the number of pins and productivity is therefore deteriorated.

As a countermeasure for such a problem, there is known a structure using columns made of conductive elastomer as the contacts. However, the elastomer used as the contacts has higher contact resistance than metal contacts, which may increase a risk of heat generation or a voltage drop when a high current is applied to the contacts. Moreover, in the IC socket using the elastomer, the contacts made of the elastomer do not wipe (scrape) metal surfaces of lands (electrodes) on the IC package when an IC package is attached to the IC socket. For this reason, even if foreign materials bonds on the metal surfaces and the metal surfaces changes in quality by forming oxide films on the metal surfaces, removing foreign materials and oxide films on the lands is not expected. Moreover, the contact resistance of the IC socket may be changed over time, because this IC socket is in contact with the metallic lands on the IC package by means of pressure contact of the elastomer.

SUMMARY OF THE INVENTION

An aspect of the present invention inheres in an IC socket includes a plate-like socket base body which includes through hole forming portions having a plurality of contact housing holes formed so as to penetrate the plate-like socket base in a front-to-back direction, and having through holes formed around the respective contact housing holes so as to penetrate the plate-like socket base in the front-to-back direction, and in which a plate-like contact piece is formed in a state of facing the through hole so as to have a base portion integrally formed on a side wall portion on a front surface side of the through hole forming portion, and a plated layer formed continuously on an inner wall of the through hole, on the front and back surfaces of the through hole forming portion, and on a surface of the contact piece.

Another aspect of the invention inheres in an IC socket complex includes a pair of IC sockets each including a plate-like socket base body which includes through hole forming portions having a plurality of contact housing holes formed so as to penetrate the plate-like socket base in a front-to-back direction, and having through holes formed around the respective contact housing holes so as to penetrate the plate-like socket base in the front-to-back direction, and in which a plate-like contact piece is formed in a state of facing the through hole so as to have a base portion integrally formed on a side wall portion on a front surface side of the through hole forming portion, and a plated layer formed continuously on an inner wall of the through hole, on the front and back surfaces of the through hole forming portion, and on a surface of the contact piece, wherein the pair of IC sockets are attached to each other with the back surfaces of the IC sockets being in contact with each other, and the plated layers on the back surfaces of the through hole forming portions are solder bonded to each other.

Another aspect of the invention inheres in a manufacturing method of an IC socket includes the steps of integrally forming, by use of synthetic resin, a plate-like socket base body which includes through hole forming portions having a plurality of contact housing holes formed so as to penetrate the plate-like socket base in a front-to-back direction, and having through holes formed around the respective contact housing holes so as to penetrate the plate-like socket base in the front-to-back direction, and in which a plate-like contact piece is formed in a state of facing the through hole so as to have a base portion integrally formed on a side wall portion on a front surface side of the through hole forming portion, and forming a plated layer continuously on an inner wall of the through hole, on the front and back surfaces of the through hole forming portion, and on a surface of the contact piece.

Another aspect of the invention inheres in an IC socket includes a plate-like socket base body including a plurality of contact housing holes formed from a front surface side, to which an IC package is to be attached, toward a back surface side, and contact fixing portions provided around the respective the contact housing holes, contact pieces each having a first end fixed to a front surface side of a corresponding one of the contact fixing portions with the contact piece facing the contact housing hole, and through hole portions each configured to bring the contact piece into conduction to the back surface side of the socket base body by penetrating the first end of the contact piece and the contact fixing portion.

Another aspect of the invention inheres in an IC socket complex includes a pair of IC sockets, each of the IC sockets including, a plate-like socket base body including a plurality of contact housing holes formed from a front surface side, to which an IC package is to be attached, toward a back surface side, and contact fixing portions provided around the respective the contact housing holes, contact pieces each having a first end fixed to a front surface side of a corresponding one of the contact fixing portions with the contact piece facing the contact housing hole, and through hole portions each configured to bring the contact piece into conduction to the back surface side of the socket base body by penetrating the first end of the contact piece and the contact fixing portion, wherein the pair of IC sockets are attached to each other with the back surfaces of the IC sockets being in contact with each other, and the plated layers on the back surfaces of the through hole forming portions are solder bonded to each other.

Another aspect of the invention inheres in a manufacturing method of an IC socket includes the steps of forming a plurality of contact pieces each including an opening for a through hole on a first end of the contact piece, by processing a metal plate, forming a plate-like socket base body having a plurality of contact housing holes denting from a front surface side, to which an IC package is attached, toward a back surface side, having the first end of each of the contact pieces fixed to a corresponding one of the contact fixing portions around the contact housing holes, and having through holes communicated with the respective openings for through holes, by setting the contact pieces on a mold for injection molding and performing injection molding of the plate-like socket base body, setting the socket base body on a mold so as to expose the through holes and part of the contact pieces, and forming a plated layer on the through holes and the exposed part of the contact pieces.

DETAILED DESCRIPTION OF EXEMPLARY EMBODIMENTS OF THE INVENTION

Figure 1:
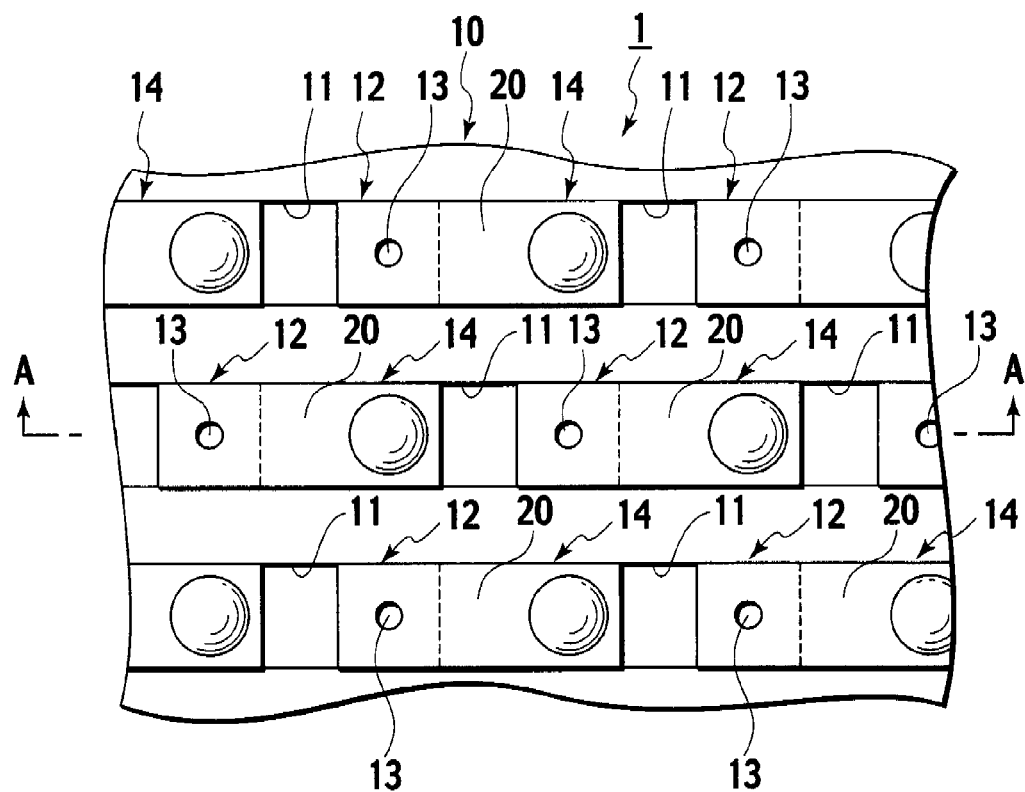
FIG. 1 is a plan view showing a chief part of an IC socket according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set fourth such as specific signal values, etc. to provide a thorough understanding of the present invention. However, it will be obvious to those skilled in the art that the present invention may be practiced without such specific details.

Now, an IC socket, an IC socket complex, and a manufacturing method of the IC socket according to the present invention will be described below based on embodiments shown in the accompanying drawings.

First Embodiment

Figure 2:
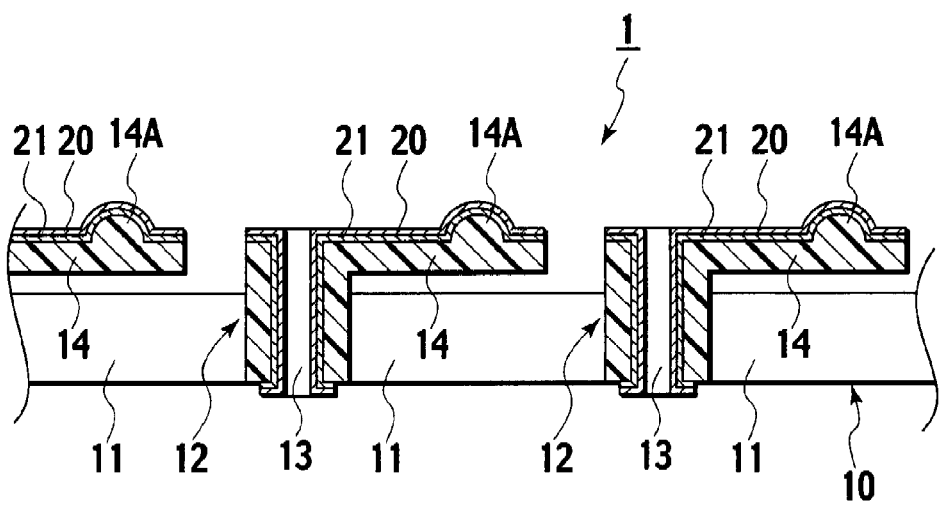
FIG. 2 is a cross-sectional view taken along the A-A line in FIG. 1.

FIG. 1 and FIG. 2 show an IC socket of this embodiment. Here, FIG. 1 is a plan view of a chief part of the IC socket and FIG. 2 is a cross-sectional view taken along the A-A line in FIG. 1.

An IC socket 1 of this embodiment is basically composed of a socket base body 10 in a substantially plate-like shape formed integrally by use of synthetic resin, and plated layers 20 provided in necessary positions on this socket base body 10.

A plurality of through holes 11 functioning as contact housing holes are formed in a predetermined layout on the socket base body 10. In this embodiment, a planar shape of each through hole 11 is formed into a rectangle.

Meanwhile, a through hole forming portion 12 in a columnar shape protruding toward an unillustrated IC package is formed in the vicinity of one peripheral portion in the longitudinal direction of each of the through holes 11 on the socket base body 10. As shown in FIG. 1 and FIG. 2, this through hole forming portion 12 is formed into the columnar shape between the through holes 11 along the longitudinal direction of the through holes 11. A through hole 13 that penetrates the socket base body 10 in the front-to-back direction is formed at this through hole forming portion 12.

Moreover, a plate-like contact piece 14 is formed on an upper side wall of this through hole forming portion 12 in a cantilever shape so as to approach an opening on a front surface side of the through hole 11. Specifically, the contact piece 14 is formed so as to protrude from one peripheral portion in the longitudinal direction of the through hole 11 toward the other peripheral end portion in parallel with the plate surface. This contact piece 14 is set to a predetermined thickness so that the dimension in the front-to-back direction of the plate shape coincides with the front-to-back direction of the socket base body 10. A semispherical contact boss 14A is integrally formed in the center on a surface on a free end side of this contact piece 14.

A catalyst layer 21 is formed on front and back surfaces of the through hole forming portion 12, on an inner side surface of the through hole 13, and on a front surface side of the contact piece 14. Moreover, a plated layer 20 is formed on a surface of this catalyst layer 21.

In the IC socket 1 of this embodiment, since all the contact pieces 14 can be formed at a lump by means of resin molding, it is possible to solve the problem of extended manufacturing time caused by an increase in the number of pins on the IC socket 1.

In this embodiment, the contact pieces 14 can establish metal contact with lands on the side of the IC package. Accordingly, it is possible to set up small contact resistance and to eliminate problems of a voltage drop and heat generation at the contact positions. Moreover, since there is a wiping function attributable to the metal pieces grazing one another, even if foreign materials bonds on the metal surfaces and the metal surfaces changes in quality by forming oxide films on the metal surfaces, it is possible to remove the foreign materials and the oxide films on the metal surfaces and thereby to achieve fresh metal contact.

(Attachment of IC Package)

Next, a case of attachment of an IC package 30 to the IC socket 1 of this embodiment will be described with reference to FIG. 3 to FIG. 5.

Figure 3:
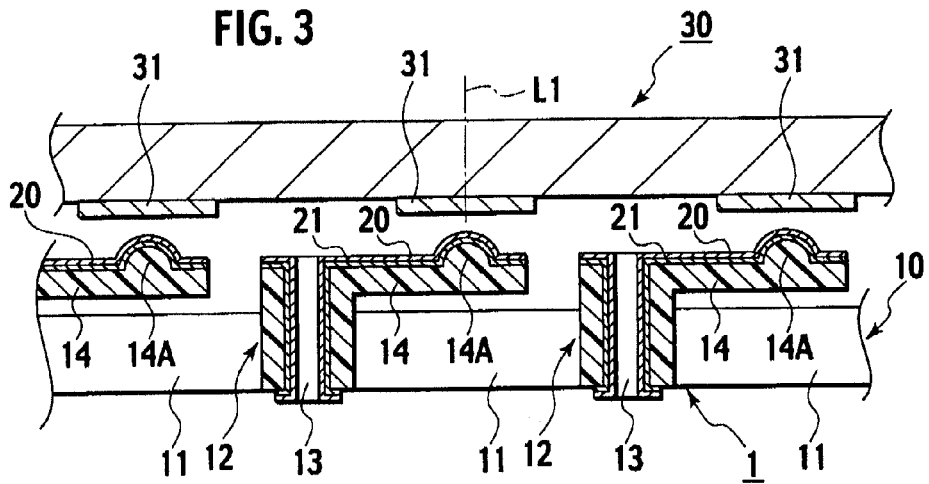
FIG. 3 is a cross-sectional view of a chief part showing a state before an IC package is attached to the IC socket according to the first embodiment.

FIG. 3 shows a state right before attachment of the IC package 30 which is aligned with the IC socket 1. This IC package 30 is a LGA package and a plurality of lands 31 are disposed on a lower surface. The contact bosses 14A, each of which is provided on a protruding portion on the second end of the contact piece 14 on the side facing the IC socket 1, are arranged similarly to the layout of the lands 31 of the IC package 30. As shown in FIG. 3, a position on the land 31 that first abuts on the contact boss 14A is a position indicated with a dashed line L1 in the drawing.

Figure 4:
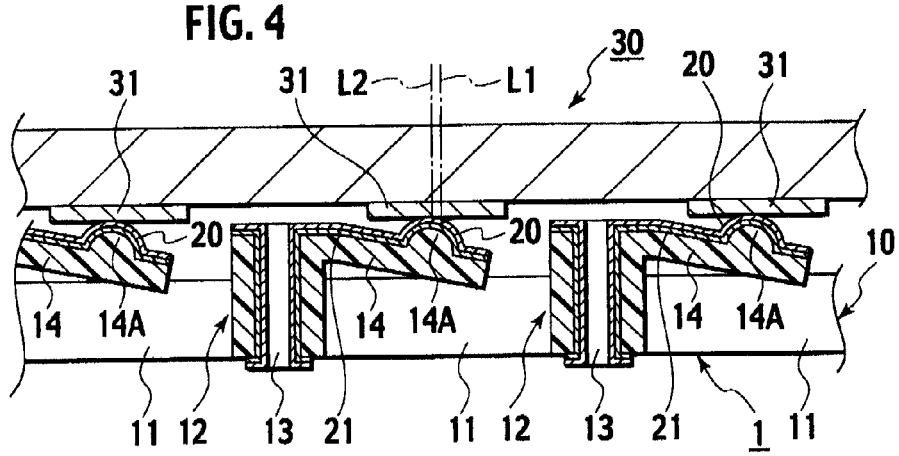
FIG. 4 is a cross-sectional view of a chief part showing a state in the course when the IC package is attached to the IC socket according to the first embodiment.

FIG. 4 shows a state in which the lands 31 of the IC package 30 are allowed to abut on the contact bosses 14A of the IC socket 1 and are then pressed thereto. In this case, as shown in FIG. 4, the contact boss 14A abuts on the land 31 in a position indicated with a dashed line L2 in the drawing. Therefore, the contact between the plated layer 20 on the surface of the contact boss 14A and the land 31 is displaced from the position on the dashed line L1 to the position on the dashed line L2 which causes the plated layer 20 and the land 31 to graze each other.

Figure 5:
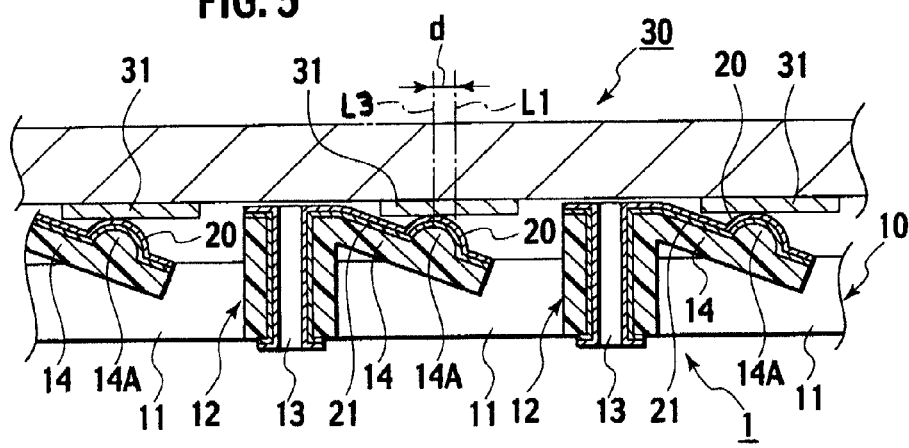
FIG. 5 is a cross-sectional view of a chief part showing a state after the IC package is attached to the IC socket according to the first embodiment.

FIG. 5 shows a state in which the lands 31 of the IC package 30 are further pressed against the contact bosses 14A of the IC socket 1. In this case, as shown in FIG. 5, the contact boss 14A abuts on the land 31 in a position indicated with a dashed line L3 in the drawing. Therefore, the abutting point between the plated layer 20 on the contact boss 14A and the land 31 is displaced from the original abutting point at a distance d while causing grazes. Lastly, the IC package 30 may be retained by an unillustrated retention lock mechanism to avoid detachment.

As the contact point is displaced while causing grazes, there is the wiping action for removing the foreign materials and the oxide films on the contact point. Therefore, the plated layer 20 and the land 31 can ensure connection with small contact resistance.

The reason why the contact point between the plated layer 20 and the land 31 can ensure contact while moving the contact point when the contact piece 14 is bent downward is attributed to the semispherical shape of the contact boss 14A. The semispherical curved surface always abuts on the land 31 even when this contact boss 14A is inclined.

(Mounting IC Socket)

A method of mounting the IC socket 1 of this embodiment may apply solder balls. Now, a method of forming the solder balls will be described below with reference to FIGS. 6A to 6C.

Figure 6A:
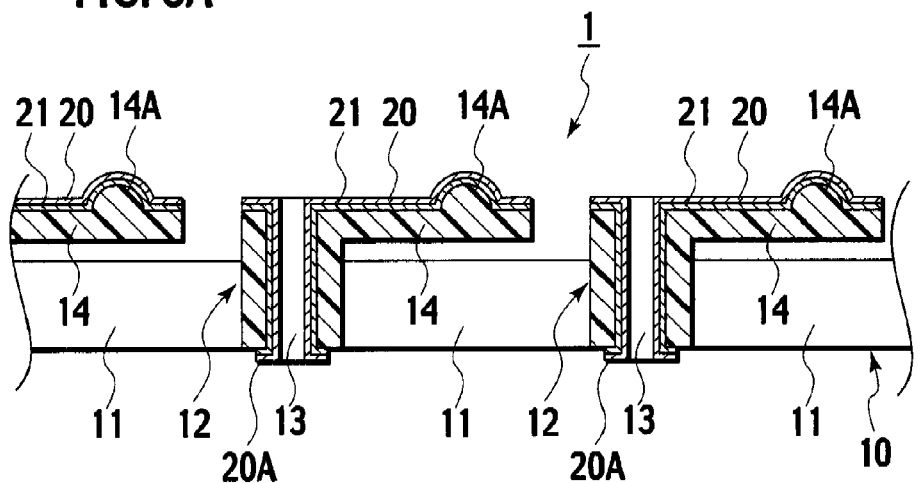
FIGS. 6A to 6C are cross-sectional views of a chief part showing a process for forming solder balls on lands on a back side of the IC socket.
Figure 6B:
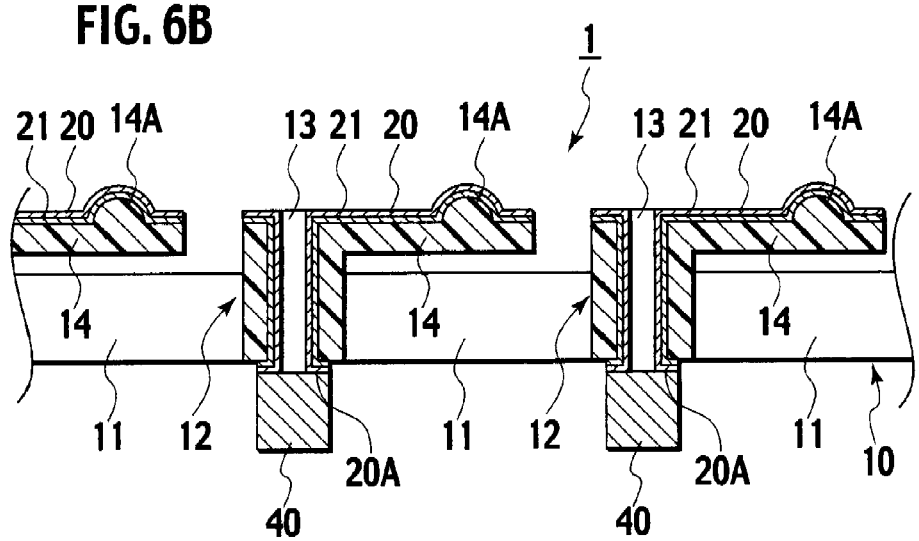

This mounting method is applicable when mounting the IC socket 1 on a mother board (main printed circuit board) of a personal computer, for example. As shown in FIGS. 6A and 6B, solder paste 40 is screen printed on lands 20A on the back side formed on the through holes 13 of the IC socket 1.

Figure 6C:
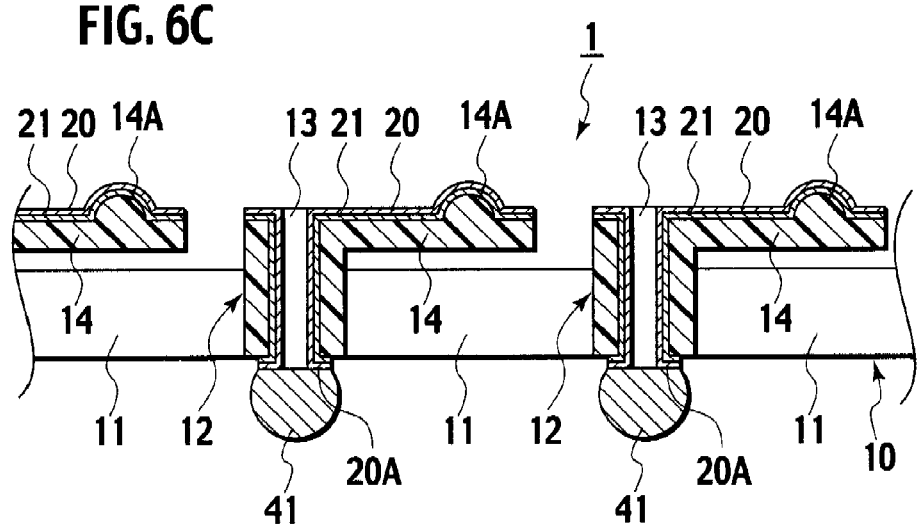

Next, as shown in FIG. 6C, the printed solder paste 40 may be changed into solder balls 41 by heating in accordance with a reflow method or the like.

The IC socket 1 thus manufactured may be mounted on the mother board by aligning and placing the IC socket 1 onto the mother board and performing solder bonding by a reflow process simultaneously when mounting other components.

(IC Socket Complex)

Figure 7:
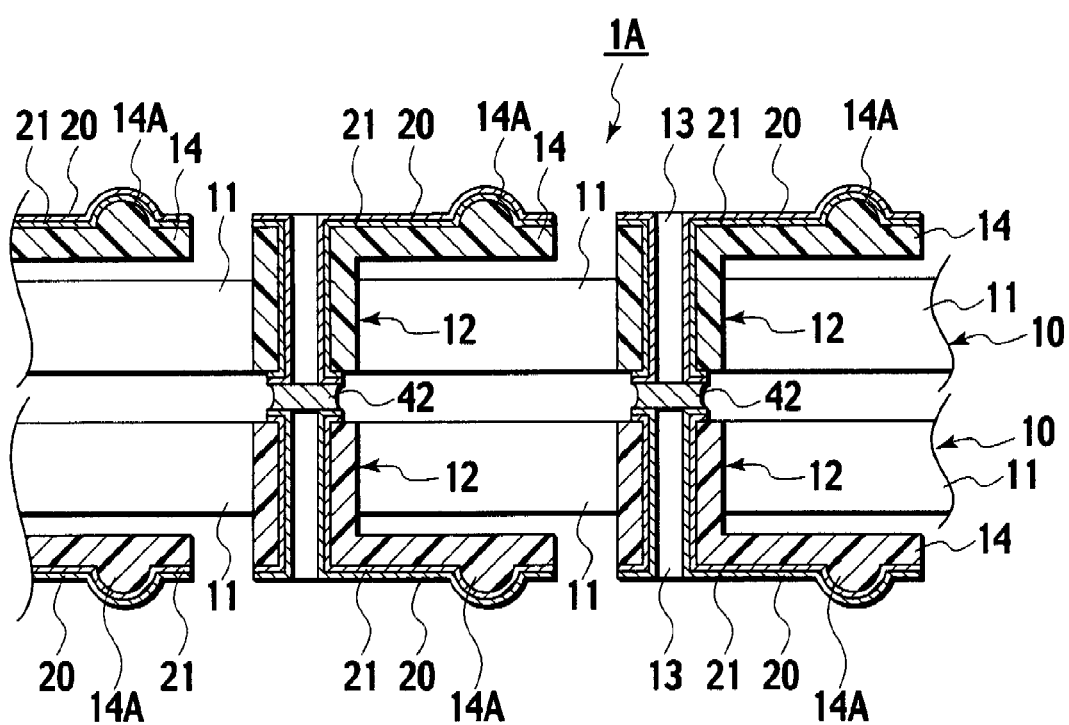
FIG. 7 is a cross-sectional view of a chief part showing an IC socket complex, which is manufactured by attaching a pair of the IC sockets according to the first embodiment to each other at lands on the back side through solder paste and performing a reflow process.

In the case of the socket for a server which requires easy maintenance of the IC socket, it is convenient to use an IC socket complex 1A as shown in FIG. 7.

As shown in FIG. 7, in a manufacturing method of this IC socket complex 1A, a pair of IC sockets 1 are prepared such that the lands 20A on the back side of the through hole forming portions 12 are rendered vertically symmetrical. Unillustrated solder paste is printed on the lands 20A on one of the IC sockets 1. Then, as shown in FIG. 7, the pair of IC sockets 1 are positioned so that the lands 20A on both of the sockets correspond to one another and then the sockets are bonded together. At this time, the solder paste is interposed between the mutually corresponding lands 20A.

Next, the IC socket complex 1A is finished by solder bonding the lands 20A on the vertical pair of IC sockets 1 to one another by heating such as a reflow process while maintaining this state.

This IC socket complex 1A has contacts on both of a front surface and a back surface. Accordingly, it is possible to realize a socket structure which is replaceable on the front surface as well as on the back surface.

(Manufacturing Method of IC Socket)

Next, a manufacturing method of the IC socket 1 of this embodiment will be described by using a molded interconnection device (MID) technique.

Figure 8A:
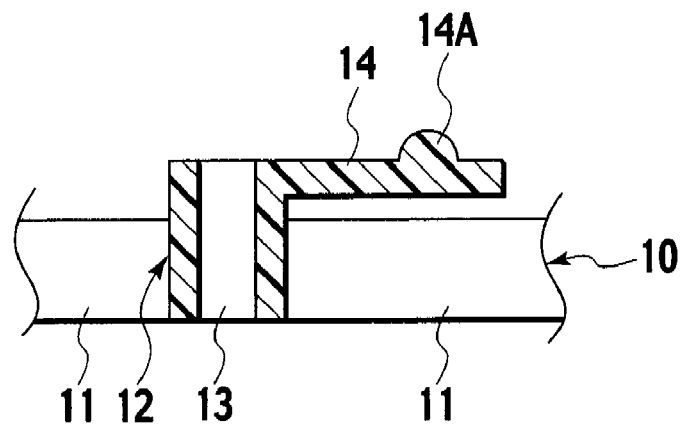
FIGS. 8A to 8C are cross-sectional views showing a manufacturing process of the IC socket according to the first embodiment.

First, a primary injection molding process is conducted for forming the socket base body 10 as shown in FIG. 8A. A surface treatment is conducted by etching a surface of the socket base body 10 thus formed.

Figure 8B:
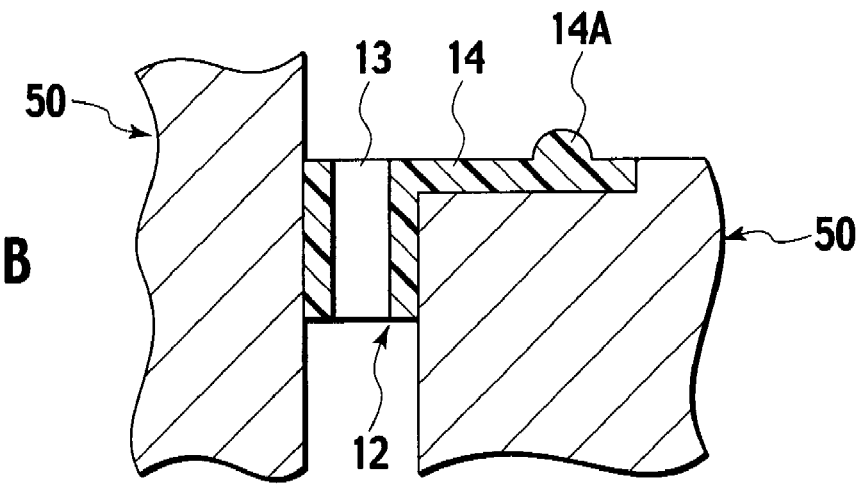
Figure 8C:
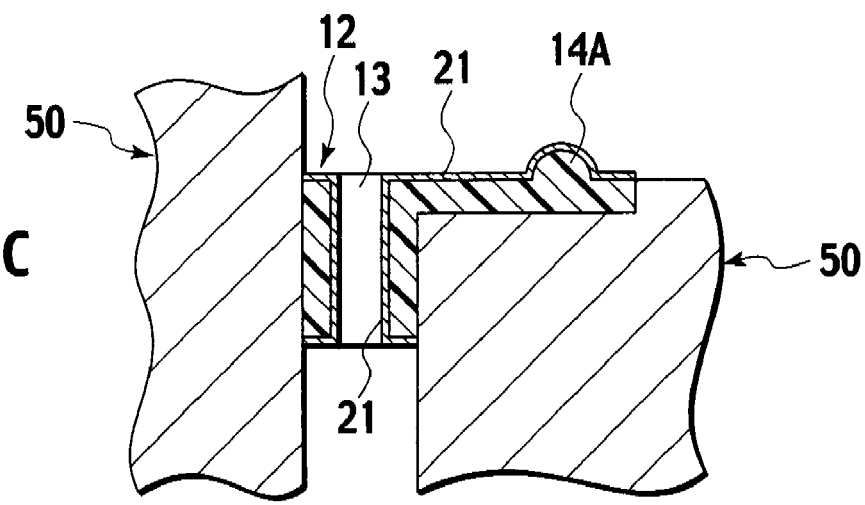

Next, a secondary injection molding process is conducted except for a region subject to plating. As shown in FIG. 8B, a mold 50 for this secondary injection molding process is a simple mask for forming a circuit. Then, as shown in FIG. 8C, the catalyst layer 21 is attached to a portion exposed from the mold 50 for the secondary injection molding process.

Figure 9A:
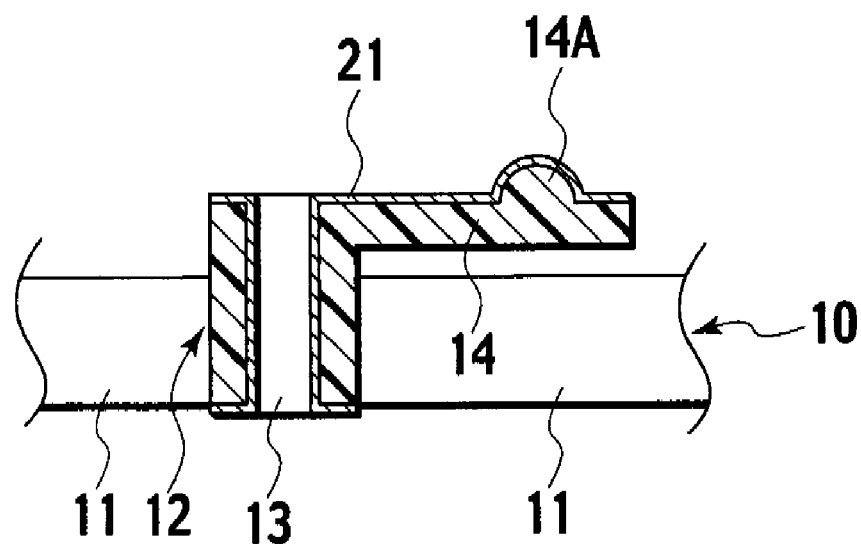
FIGS. 9A and 9B are cross-sectional views showing the manufacturing process of the IC socket according to the first embodiment.
Figure 9B:
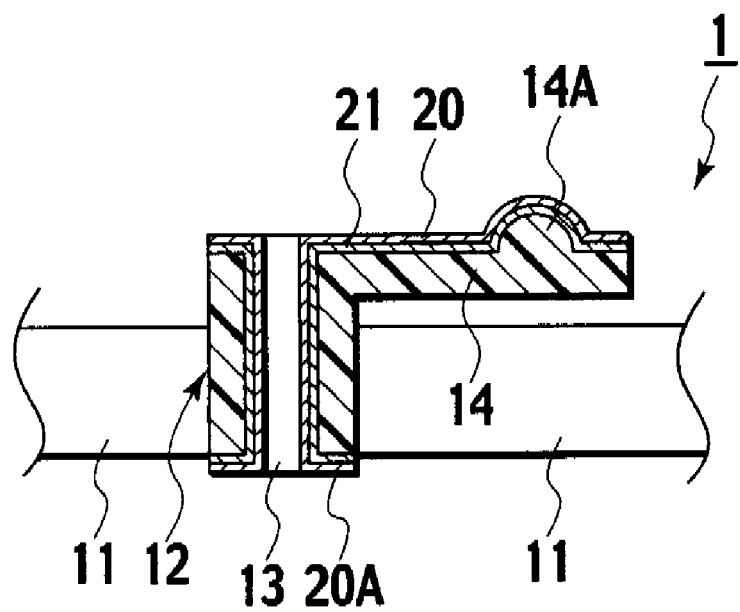

Then, a plating process is conducted after removing the mold 50 for the secondary injection molding process as shown in FIG. 9A. In this way, it is possible to form a three-dimensional circuit with the plated layer 20 as shown in FIG. 9B. In this plating process, the plated layer 20 is formed on the catalyst layer 21. Here, it is possible to carry out either electroless plating or electrolytic plating as the plating process.

Meanwhile, as shown in FIGS. 6A to 6C, it is also possible to form the solder ball 41 on the land 20A of the plated layer 20 on a back surface of the through hole forming portion 12 and then to provide a retention lock mechanism component.

Here, an example of concrete specifications of the IC socket 1 will be described.

| | |
|---|---|
| Circuit width | 0.2 mm or above |
| Circuit interval | 0.2 mm or above |
| Plate thickness of contact piece | 0.3 mm or above |
| Diameter of through hole | φ 0.2 mm |
| Foundation layer for plating | Cu: 4 to 10 μm |
| Intermediate layer for plating | Ni: 6 to 20 μm |
| Top layer for plating | Au: 0.1 to 0.3 μm |
| Applied resin | LCP, SPS, PA, PPA, PPS, PC-ABS, PEI |

Although the above example of specifications shows a case of providing the foundation layer (Cu), the intermediate layer (Ni), and the top layer (Au) in the plating process, it is also possible to omit the intermediate layer depending on the environment of specifications and to plate the Au layer directly on the Cu layer.

Moreover, although the applied resin may be selected depending on required characteristics, a liquid crystal polymer (LCP) is an effective material for its low dielectric constant when an electric characteristic is important. When using the LCP, it is easier to enhance heat resistance and to realize a product having sufficient reflow resistance. In addition, there is also an advantage of high strength. On the contrary, there are also some disadvantages including anisotropy of mechanical strength and low weld strength. Nevertheless, techniques of engineering plastics have marked significant advances in recent years and new materials called super engineering plastics designed to achieve previously contradictory features have been developed one after another. Since the MID technique is applicable to a broad range of materials suitable for injection molding, there will be more options of purpose-designed resin in the near future.

By applying the MID technique, the IC socket 1 of this embodiment has significantly higher productivity than conventional IC sockets and can support the increase in the number of pins, a finer pitch, a larger current, and higher speed.

Specifically, since a plurality of contact housing holes formed on the socket base body 10 are the through holes 11, the structure of the mold is simple when molding the socket base body 10 with resin. Accordingly, there is an advantage that it is possible to perform molding easily and at low costs.

Second Embodiment

Figure 10:
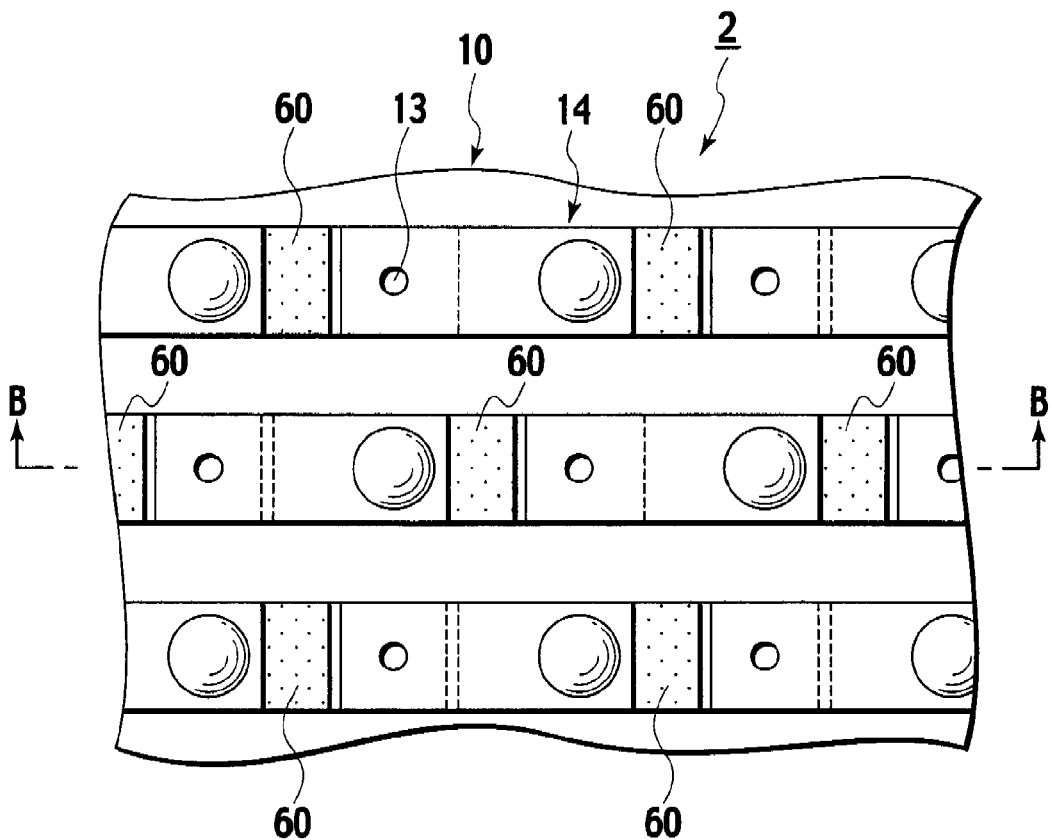
FIG. 10 is a plan view of a chief part of an IC socket according to a second embodiment.
Figure 11:
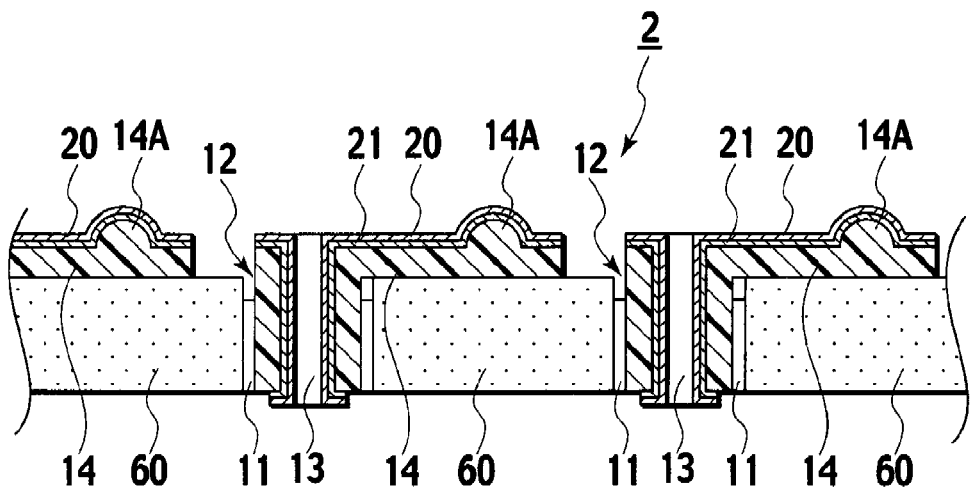
FIG. 11 is a cross-sectional view taken along the B-B line in FIG. 10.

FIG. 10 and FIG. 11 show an IC socket 2 according to a second embodiment of the present invention. FIG. 10 is a plan view of a chief part of the IC socket and FIG. 11 is a cross-sectional view taken along the B-B line in FIG. 10.

The IC socket 2 of this embodiment is configured to add elastomer 60 to be described later to the IC socket 1 according to the first embodiment. Other features of the IC socket 2 are similar to those of the first embodiment. Therefore, concerning the IC socket 2, the same constituents as those in the first embodiment will be designated by the same reference numerals and detailed explanation will be omitted herein.

As shown in FIG. 10 and FIG. 11, the elastomer 60 representing a material having elasticity (resilience) for adjusting contact pressure of the contact piece 14 and for suppressing reduction in the contact pressure associated with deformation of the contact piece 14 is disposed inside the through hole 11 of the IC socket 2 of this embodiment. Here, the material having the resilience may be the material such as fluorine-containing elastomer which has fine heat resistance, chemical resistance and creep resistance. If the material has sufficient heat resistance to withstand a temperature of 230° C. or higher, then the material can withstand a reflow process.

The IC socket 2 of this embodiment can also exert similar operations and effects to those in the above-described first embodiment. Moreover, a manufacturing method of the IC socket 2 of this embodiment is similar to the manufacturing method of the IC socket 1 of the above-described first embodiment. Here, a process to form the elastomer 60 inside the through hole 11 is incorporated after formation of the socket base body (a socket housing) 10.

Third Embodiment

Figure 12:
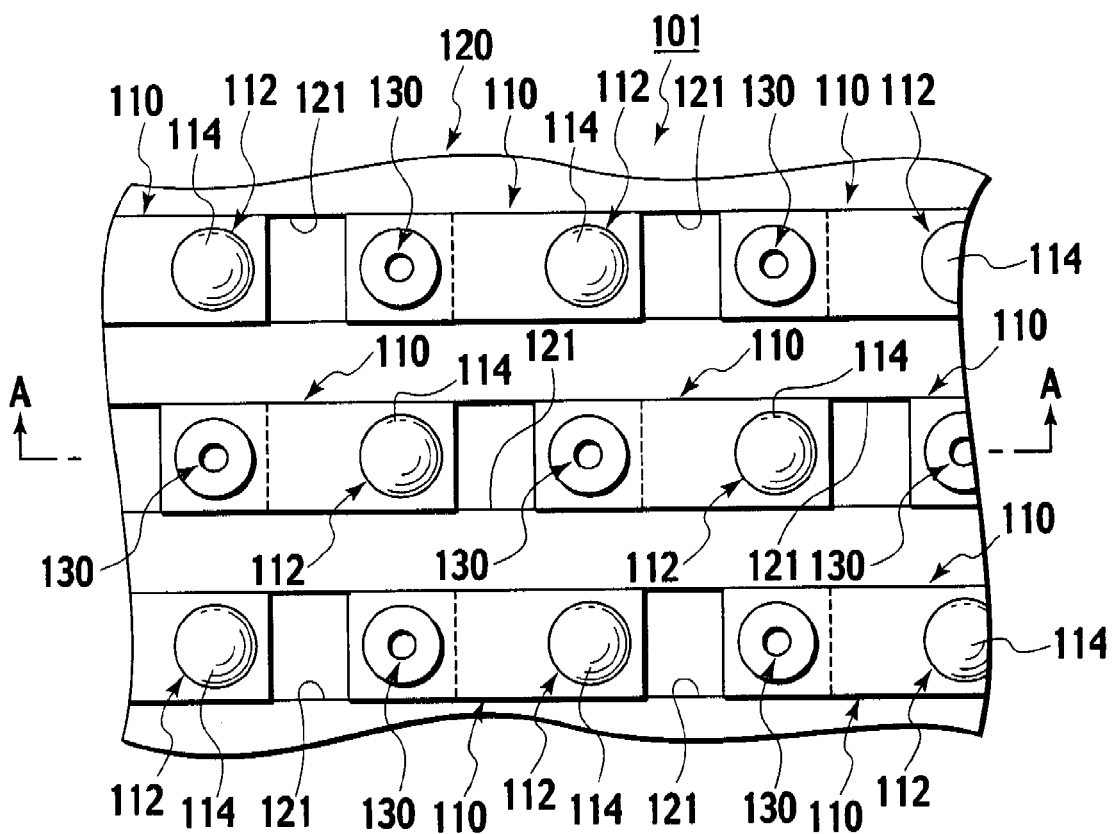
FIG. 12 is a plan view of a chief part of an IC socket according to a third embodiment of the present invention.
Figure 13:
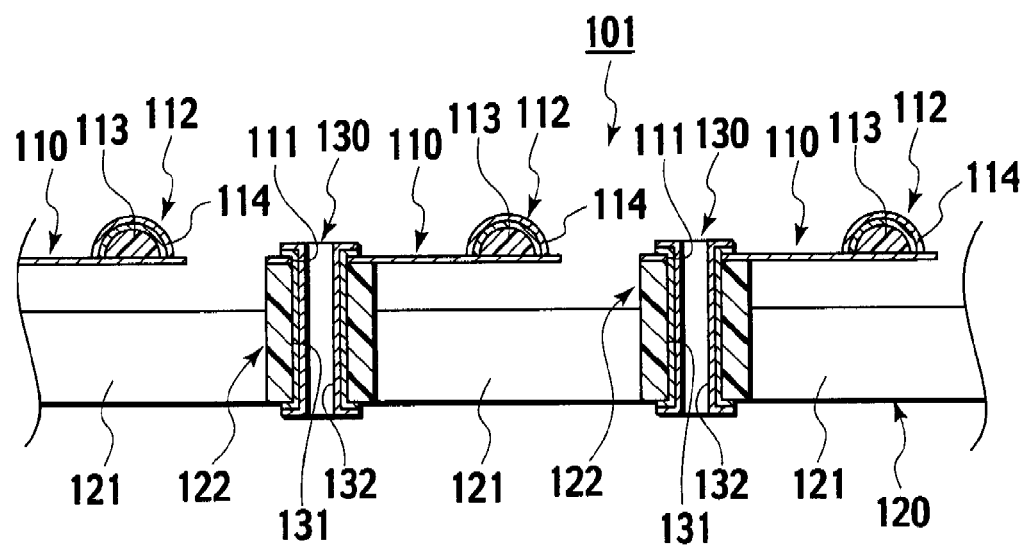
FIG. 13 is a cross-sectional view taken along the A-A line in FIG. 12.

FIG. 12 and FIG. 13 show an IC socket according to a third embodiment. Here, FIG. 12 is a plan view of a chief part of the IC socket according to the third embodiment and FIG. 13 is a cross-sectional view taken along the A-A line in FIG. 12.

An IC socket 101 of this embodiment is basically composed of a plurality of contact pieces 110, a socket base body 120 for disposing these contact pieces 110 in predetermined arrangement, and through hole sections 130.

Each of the contact pieces 110 is formed by shaping a metal plate having conductivity and the resilience (springiness), which is made of a copper alloy such as beryllium copper or phosphor bronze, a stainless steel alloy, for example. This contact piece 110 is formed into a rectangular shape and an opening 111 for communicating with a through hole 131 to be described later is formed on the first end thereof.

As shown in FIG. 13, a contact boss 112 that bulges toward the IC package (not shown) to be attached is formed on the second end of the contact piece 110. This contact boss 112 includes a resin boss 113 formed into a semispherical shape on an upper surface of the contact piece 110, and a plated layer 114 formed so as to seal this resin boss 113.

Through holes 121 functioning as contact housing holes are formed in a predetermined layout on the socket base body 120. In this embodiment, a planar shape of each through hole 121 is formed into a rectangle. Moreover, a columnar contact fixing portion 122 that protrudes toward the unillustrated IC package is formed in the vicinity of one peripheral portion of each through hole 121 on the socket base body 120. As shown in FIG. 12 and FIG. 13, this contact fixing portion 122 is formed into the columnar shape between the through holes 121 along the longitudinal direction of the through holes 121. A through hole 131 that penetrates the socket base body 120 in the front-to-back direction is formed at this through hole fixing portion 122. Moreover, the first end of the contact piece 110 is fixed to an upper part of this contact fixing portion 122 so that the through hole 131 at the contact fixing portion 122 communicates with the opening 111 on this contact piece 110.

As described previously, the first end of the contact piece 110 is fixed to this contact fixing portion 122, portions other than this end approach the through hole 121.

The though hole section 130 is composed of a plated layer 132 which is formed on a fringe of the opening 111 of the contact piece 110 as well as on a fringe on a back side of the through hole 131 across an inner wall of the through hole 131 that penetrates the contact fixing portion 122 in the front-to-back direction in the state of aligning the opening 111 of the contact piece 110 with the through hole 131. Here, catalyst layers may be formed as foundation layers for the plated layers 114 and 132.

According to the IC socket 101 of this embodiment, the contact piece 110 can establish metal contact with the land on the IC package. Therefore, it is possible to set up small contact resistance.

(Attachment of IC Package)

Next, a case of attachment of an IC package 140 to the IC socket 101 of this embodiment will be described with reference to FIG. 14 to FIG. 16.

Figure 14:
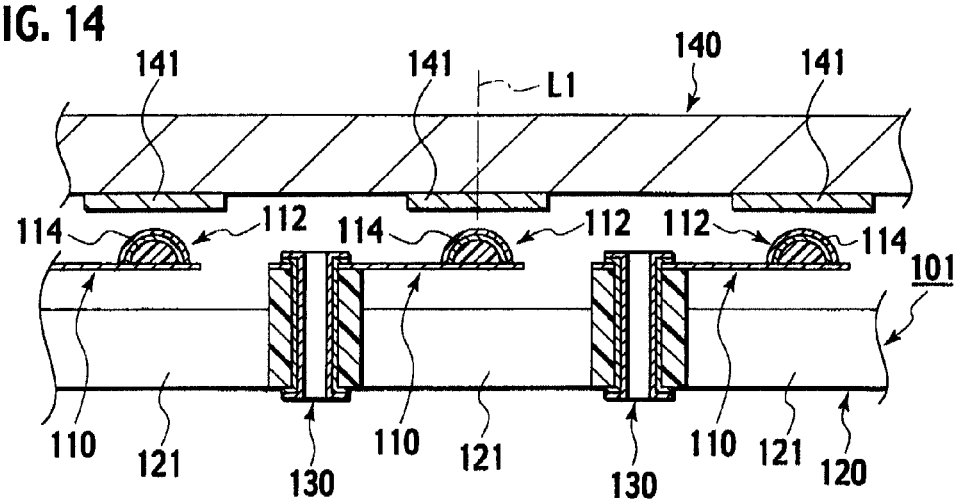
FIG. 14 is a cross-sectional view of a chief part showing a state before attaching an IC package to the IC socket according to the third embodiment.

FIG. 14 shows a state right before attachment of the IC package 140 which is aligned with the IC socket 101. This IC package 140 is a LGA package and a plurality of lands 141 are disposed on a lower surface. The contact bosses 112, each of which is provided on a protruding portion on the second end of the contact piece 110 on the side facing the IC socket 101, are arranged similarly to the layout of the lands 141 of the IC package 140. As shown in FIG. 14, a position on the land 141 that first abuts on the contact boss 112 is a position indicated with a dashed line L1 in the drawing.

Figure 15:
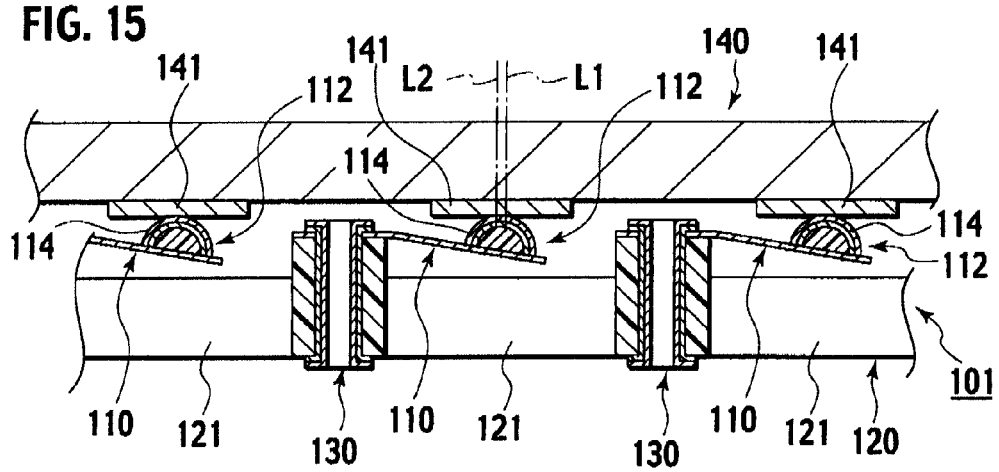
FIG. 15 is a cross-sectional view of a chief part showing a state in the course when the IC package is attached to the IC socket according to the third embodiment.

FIG. 15 shows a state in which the lands 141 of the IC package 140 are allowed to abut on the contact bosses 112 of the IC socket 101 and are then pressed thereto. In this case, as shown in FIG. 15, the contact boss 112 abuts on the land 141 in a position indicated with a dashed line L2 in the drawing. Therefore, the contact between the plated layer 114 on the surface of the contact boss 112 and the land 141 is displaced from the position on the dashed line L1 to the position on the dashed line L2 while causing grazes.

Figure 16:
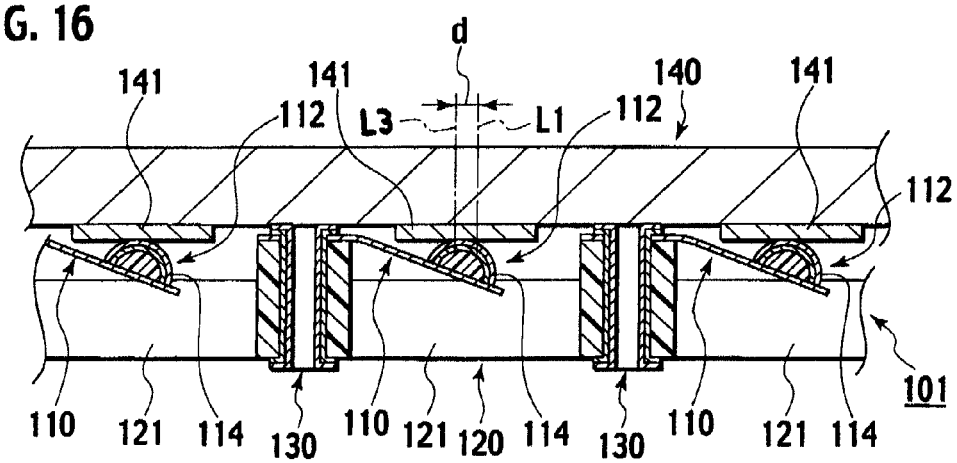
FIG. 16 is a cross-sectional view of a chief part showing a state after the IC package is attached to the IC socket according to the third embodiment.

FIG. 16 shows a state in which the lands 141 of the IC package 140 are further pressed against the contact bosses 112 of the IC socket 101. In this case, as shown in FIG. 16, the contact boss 112 abuts on the land 141 in a position indicated with a dashed line L3 in the drawing. Therefore, the abutting point between the plated layer 114 on the contact boss 112 and the land 141 is displaced from the original abutting point at a distance d while causing grazes. Lastly, the IC package 140 may be retained by an unillustrated retention lock mechanism to avoid detachment.

As the contact point is displaced while causing grazes, there is the wiping action for removing the foreign materials and the oxide films on the contact point. Therefore, the plated layer 114 and the land 141 can ensure connection with small contact resistance.

(Mounting IC Socket)

A method of mounting the IC socket 101 of this embodiment may use solder balls. Now, a method of forming the solder balls will be described below with reference to FIGS. 17A to 17C.

Figure 17A:
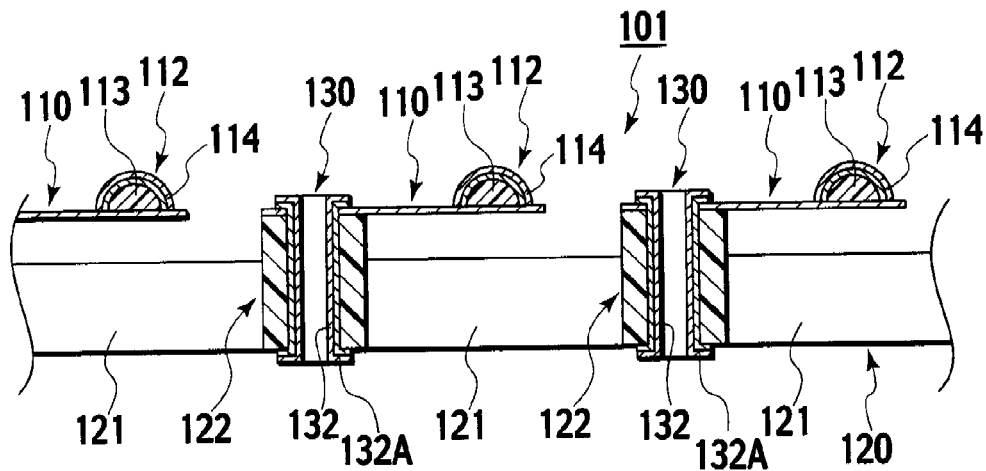
FIGS. 17A to 17C are cross-sectional views of a chief part showing a process for forming solder balls on lands on a back side of the IC socket according to the third embodiment.
Figure 17B:
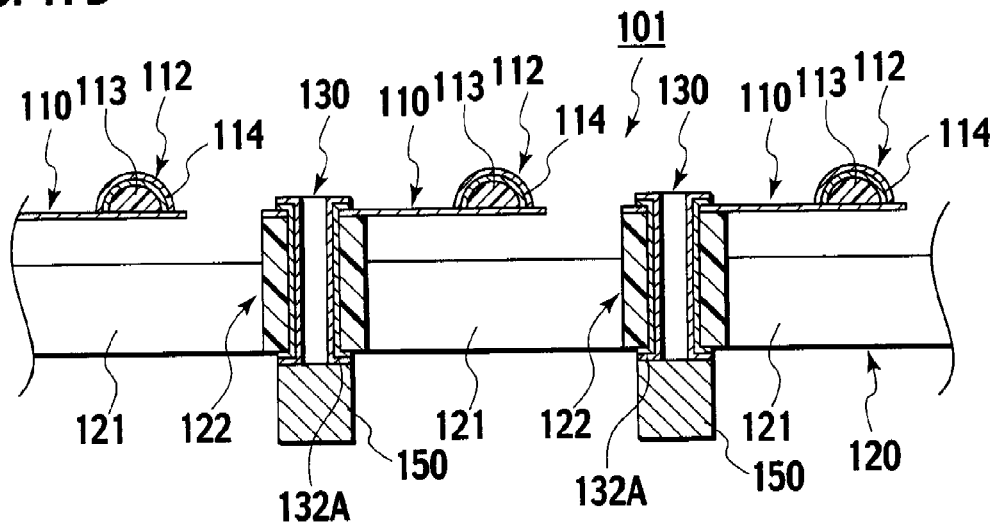

This mounting method is applicable when mounting the IC socket 101 on a mother board (main printed circuit board) of a personal computer, for example. As shown in FIGS. 17A and 17B, solder paste 150 is screen printed on lands 132A on the back side formed on the through hole sections 130 of the IC socket 101.

Figure 17C:
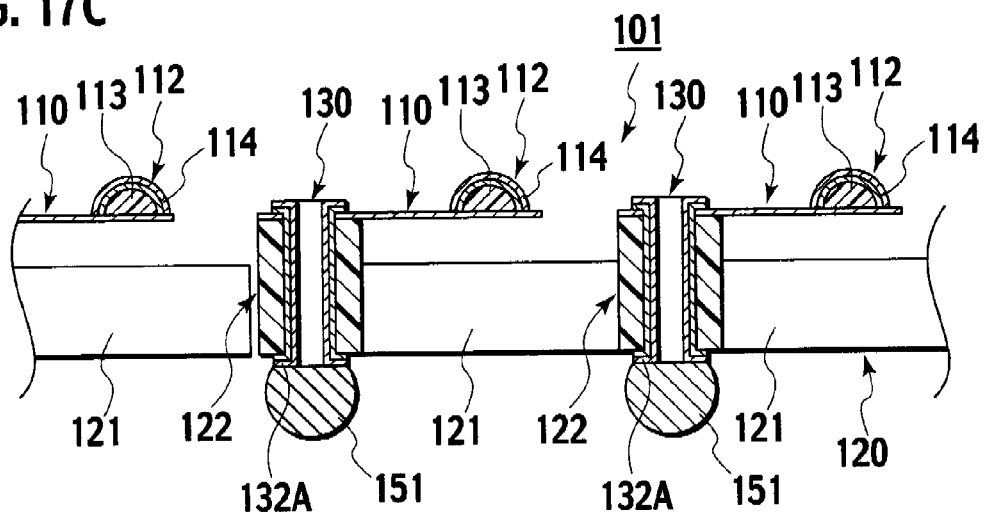

Next, as shown in FIG. 17C, the printed solder paste 150 may be changed into solder balls 151 by heating in accordance with a reflow method or the like.

The IC socket 101 thus manufactured may be mounted on the mother board by aligning and placing the IC socket 101 onto the mother board and performing solder bonding by a reflow process simultaneously when mounting other components.

(IC Socket Complex)

Figure 18A:
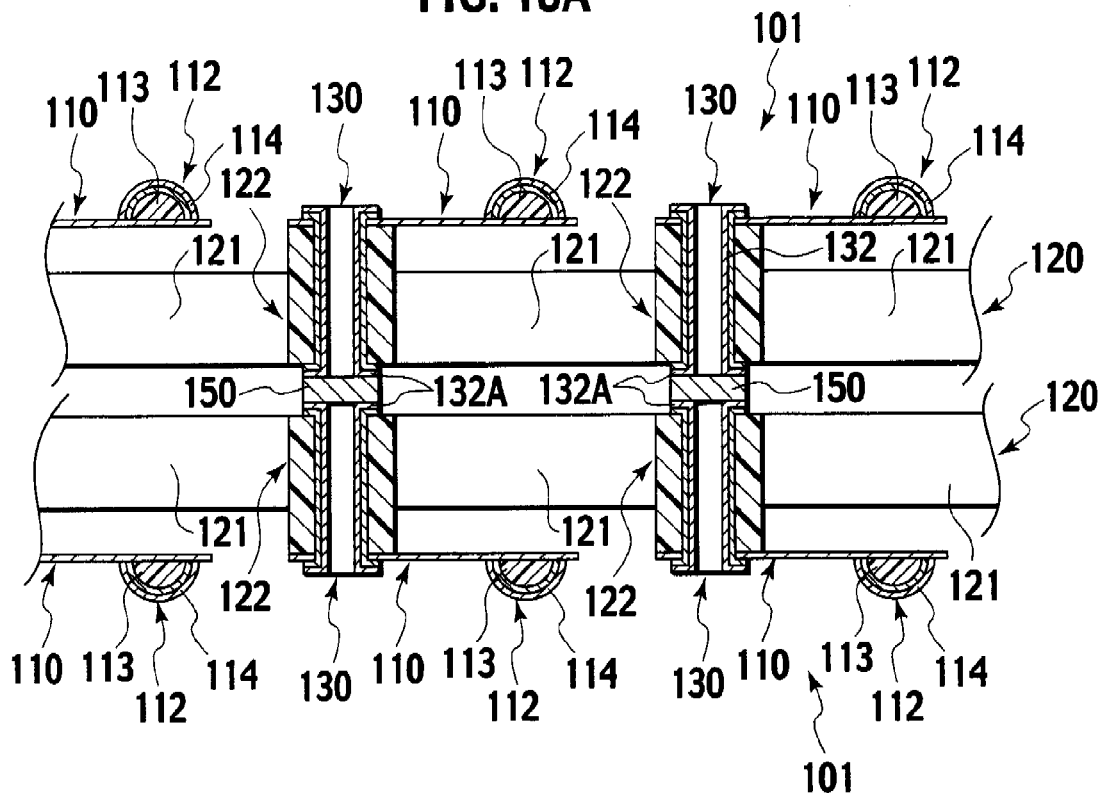
FIG. 18A is a cross-sectional view of a chief part showing a state of attaching a pair of the IC sockets according to the third embodiment to each other at lands on the back side through solder paste.
Figure 18B:
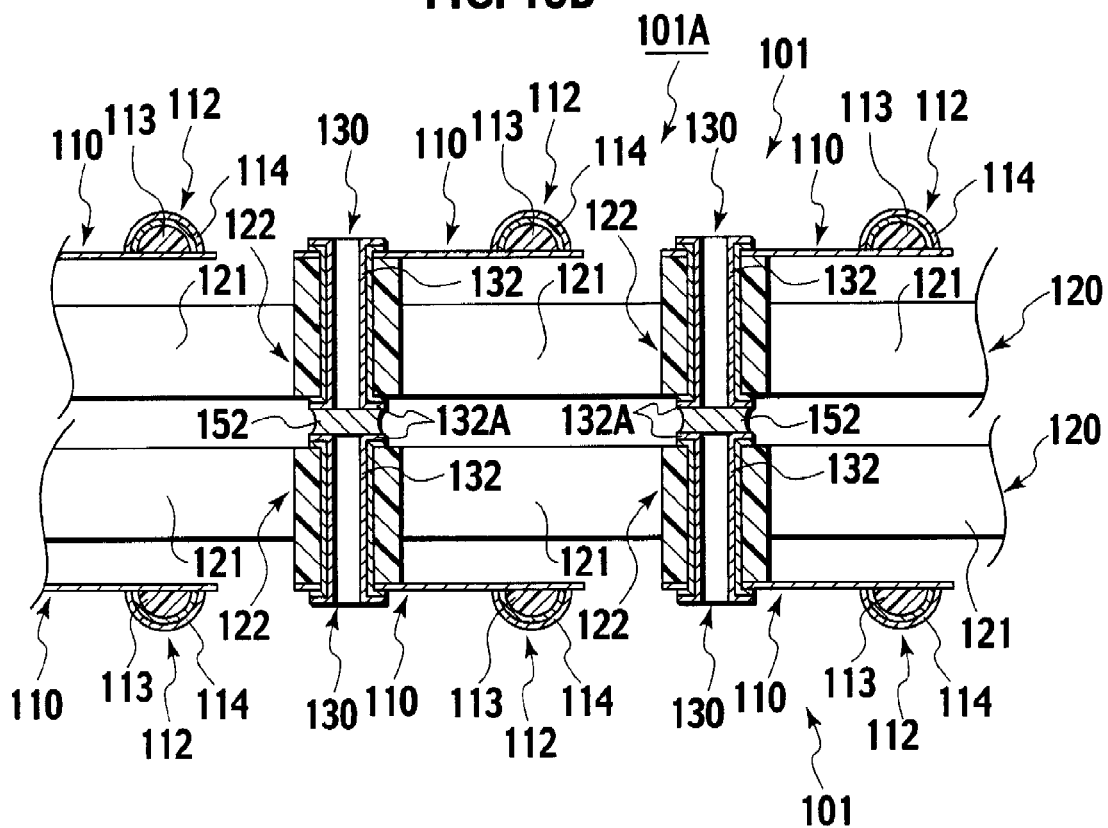
FIG. 18B is a cross-sectional view of a chief part showing an IC socket complex manufactured by performing a reflow process.

In the case of the socket for a server which requires easy maintenance of the IC socket, it is convenient to use an IC socket complex 101A as shown in FIG. 18B.

As shown in FIG. 18A, in a manufacturing method of this IC socket complex 101A, a pair of IC sockets 101 are prepared such that the lands 132A on the back side of the through hole sections 130 are rendered vertically symmetrical. As shown in FIG. 18A, the solder paste 150 is printed on the lands 132A on one of the IC sockets 101. Then, as shown in FIG. 18A, the pair of IC sockets 101 are positioned so that the lands 132A on both of the sockets correspond to one another and then the sockets are bonded together. At this time, as shown in FIG. 18A, the solder paste 150 is interposed between the mutually corresponding lands 132A.

Next, the IC socket complex 101A is finished by solder bonding the lands 132A on the vertical pair of IC sockets 101 to one another by heating such as a reflow process while maintaining this state.

This IC socket complex 101A has contacts on both of a front surface and a back surface. Accordingly, it is possible to realize a socket structure which is replaceable on the front surface as well as on the back surface.

(Manufacturing Method of IC Socket)

Next, a manufacturing method of the IC socket 101 of this embodiment will be described by using the molded interconnection device (MID) technique.

Figure 19A:
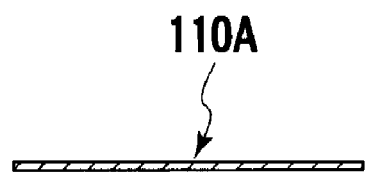
FIGS. 19A to 19C are views showing a manufacturing process of the IC socket according to the third embodiment, which illustrate a metal plate constituting a contact piece, and the contact pieces fabricated by shaping the metal plate, and a primary molded product.
Figure 19B:
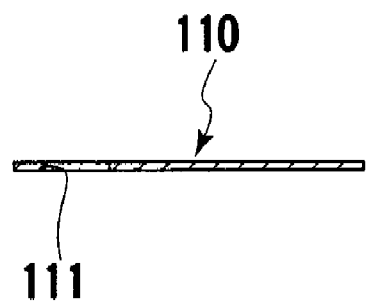

First, as shown in FIG. 19A, a metal plate 110A is prepared and the contact piece 110 as shown in FIG. 19B is formed by shaping in accordance with etching or press working, for example. This contact piece 110 is formed into the rectangular shape as shown in FIG. 12, and the opening 111 is formed on one side thereof.

Figure 21:
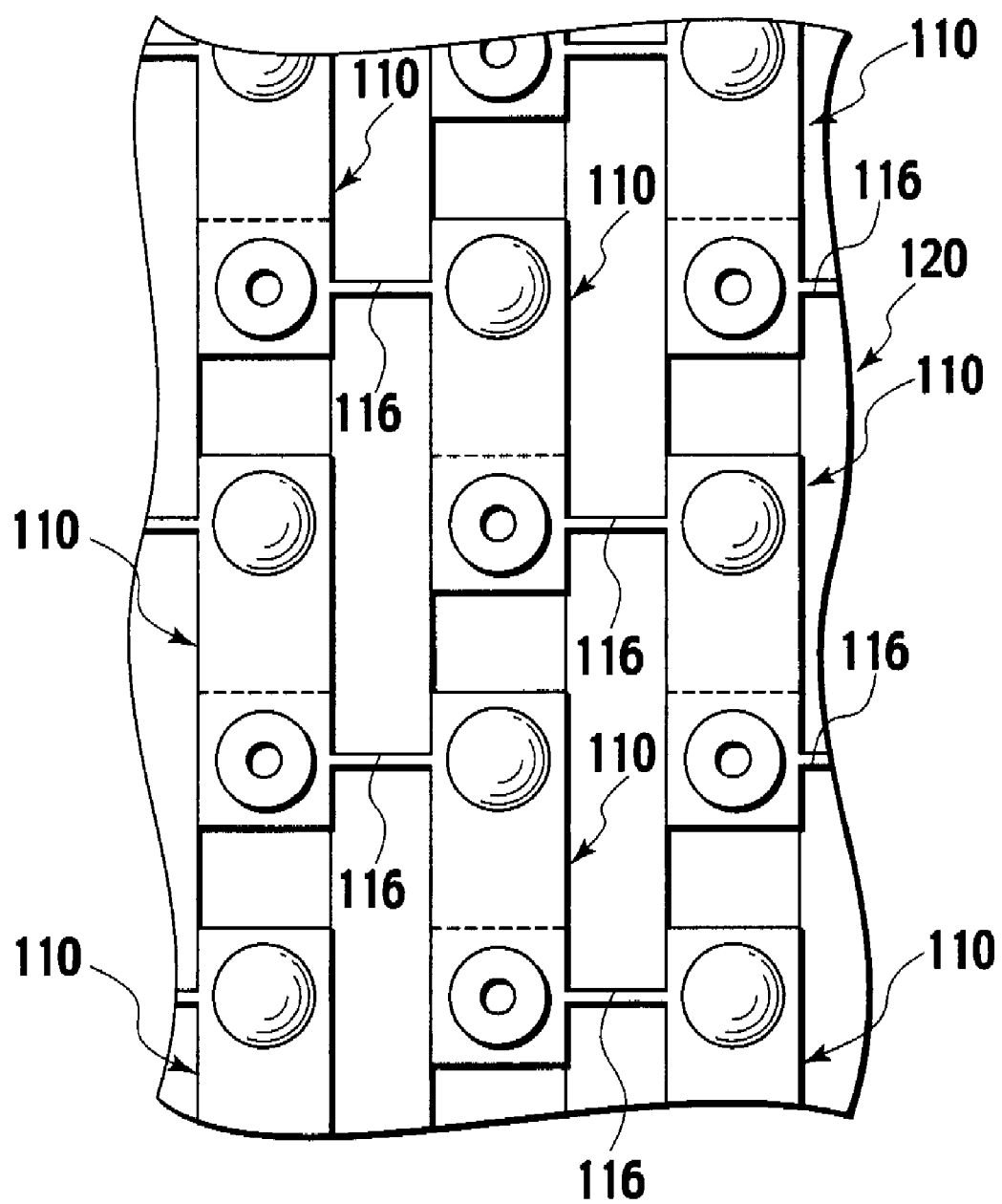
FIG. 21 is a plan view of a chief part showing a state before cutting runners of the IC socket according to the third embodiment of the present invention.
Figure 22:
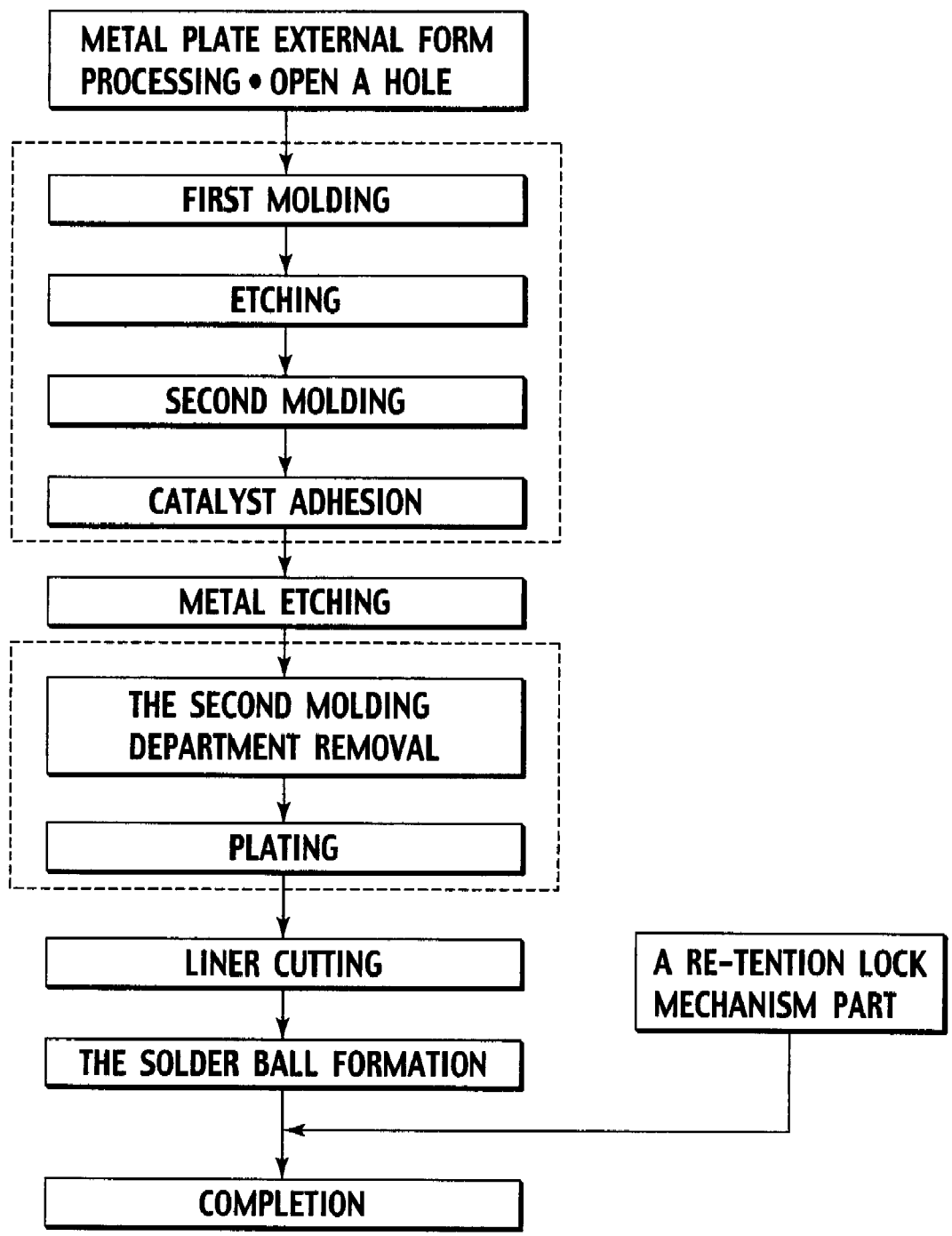
FIG. 22 is a flowchart showing a manufacturing method of the IC socket according to the third embodiment.

The contact pieces 110 are prepared in the same quantity as the contacts required for the IC socket 101 to be manufactured. To facilitate later processes, these contact pieces 110 are shaped to satisfy the quantity of the required contacts and are provided integrally by the use of runners 116, to be described later, in the form corresponding to the final arrangement of the contact pieces 110 of the IC socket 101. When necessary, it is also possible to divide the integrated and processed contact pieces into two or more parts. However, for easy handling throughout the processes, it is preferable to process all the contact pieces 110 as an integrated block. FIG. 21 is a plan view of a work-in-progress of the IC socket 101, which shows a state of the contact pieces 110 integrated and connected to one another through the runners 116. When the contact pieces 110 are electrically connected to one another through the runners 116, as shown in the drawing, it is possible to apply electrolytic plating in a plating process.

Figure 19C:
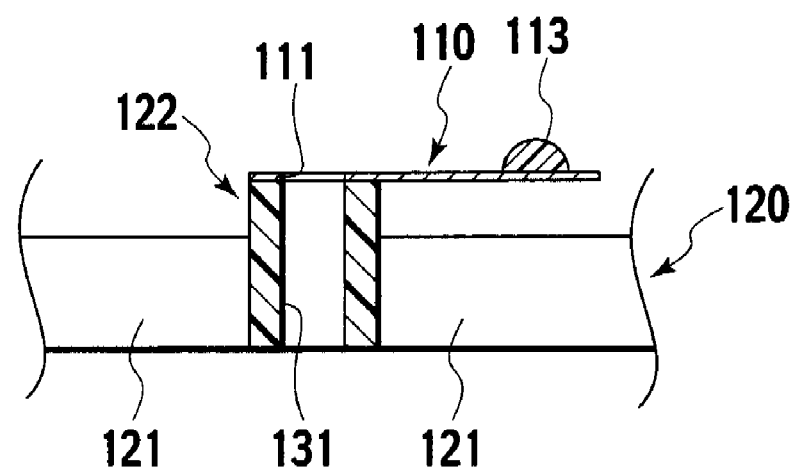

Next, the integrated contact pieces 110 are set on a mold and a primary injection molding process is conducted. As a result, the first end of each contact piece 110 is inserted (bonded in this embodiment) to the socket base body 120 as shown in FIG. 19C, and the resin boss 113 is formed on the surface of the second end of the contact piece 110. In this way, a half-finished product is fabricated.

Thereafter, a surface treatment is conducted by etching in the state shown in FIG. 19C.

Figure 20A:
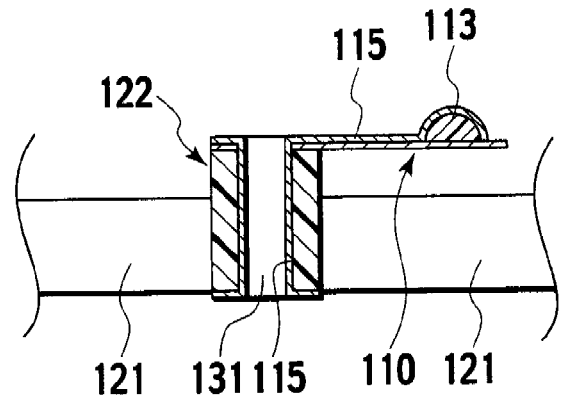
FIGS. 20A to 20C are views showing the manufacturing process of the IC socket according to the third embodiment, which illustrate a state of forming a catalyst layer, a state of etching the catalyst layer, and a state of forming a plated layer, respectively.

Next, a secondary injection molding process is conducted in regions except for a region subject to plating. A mold for this secondary injection molding process is a simple mask for forming a circuit. Illustration of the mold for the secondary injection molding is omitted in FIG. 20A. Then, as shown in FIG. 20A, a catalyst layer 115 is attached to a portion exposed from the unillustrated mold for the secondary injection molding process.

Figure 20B:
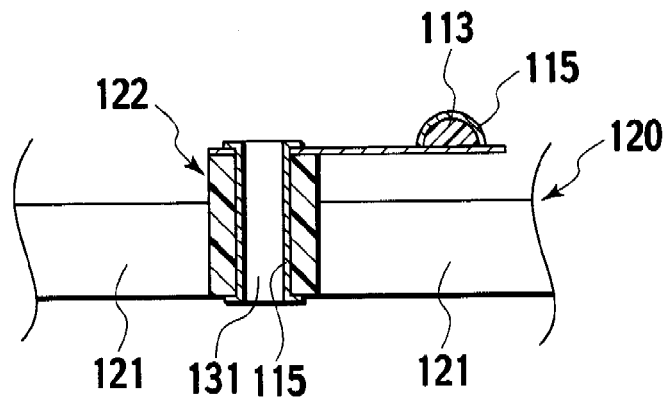

Subsequently, as shown in FIG. 20B, the catalyst layer 115 is subjected to etching so as to leave the catalyst layer 115 on a surrounding portion of the opening 111 of the contact piece 110 and on the resin boss 113.

Figure 20C:
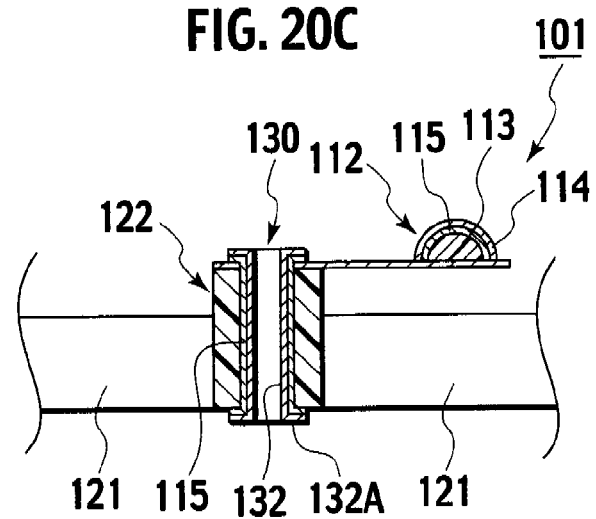

Thereafter, it is possible to form a three-dimensional circuit as shown in FIG. 20C by removing the mold for the secondary injection molding and performing an electrolytic plating process. In this plating process, the plated layer 114 on the surface of the contact boss 112 and the plated layer 132 on the surface of the catalyst layer 115 inside the through hole 131 are formed at the same time. Although the electrolytic plating is used in this embodiment, it is possible to perform electroless plating instead.

Thereafter, production of the IC socket 101 of this embodiment is completed by appropriately cutting the runners 116. Meanwhile, as shown in FIGS. 17A to 17C, it is also possible to form the solder ball 151 on the land 132A of the plated layer 132 on the back surface of the through hole section 130 and then to provide a retention lock mechanism component.

Here, an example of concrete specifications of the IC socket 101 will be described.

| | |
|---|---|
| Circuit width | 0.2 mm or above |
| Circuit interval | 0.2 mm or above |
| Plate thickness of contact piece | 0.3 mm or above |
| Diameter of through hole | φ 0.2 mm |
| Foundation layer for plating | Cu: 4 to 10 μm |
| Intermediate layer for plating | Ni: 6 to 20 μm |
| Top layer for plating | Au: 0.1 to 0.3 μm |
| Applied resin | LCP, SPS, PA, PPA, PPS, PC-ABS, PEI |

Although the above example of specifications shows a case of providing the foundation layer (Cu), the intermediate layer (Ni), and the top layer (Au) in the plating process, it is also possible to omit the intermediate layer depending on the environment of specifications and to plate Au layer directly on the Cu layer.

Moreover, although the applied resin may be selected depending on required characteristics, a liquid crystal polymer (LCP) is an effective material for its low dielectric constant when an electric characteristic is important. When using the LCP, it is easier to enhance heat resistance and to realize a product having sufficient reflow resistance. In addition, there is also an advantage of high strength. On the contrary, there are also some disadvantages including anisotropy of mechanical strength and low weld strength. Nevertheless, techniques of engineering plastics have marked significant advances in recent years and new materials called super engineering plastics designed to achieve previously contradictory features have been developed one after another. Since the MID technique is applicable to a broad range of materials suitable for injection molding, there will be more options of purpose-designed resin in the near future.

By applying the MID technique, the IC socket 101 of this embodiment has significantly higher productivity than conventional IC sockets and can support the increase in the number of pins, a finer pitch, a larger current, and higher speed.

Fourth Embodiment

Figure 23:
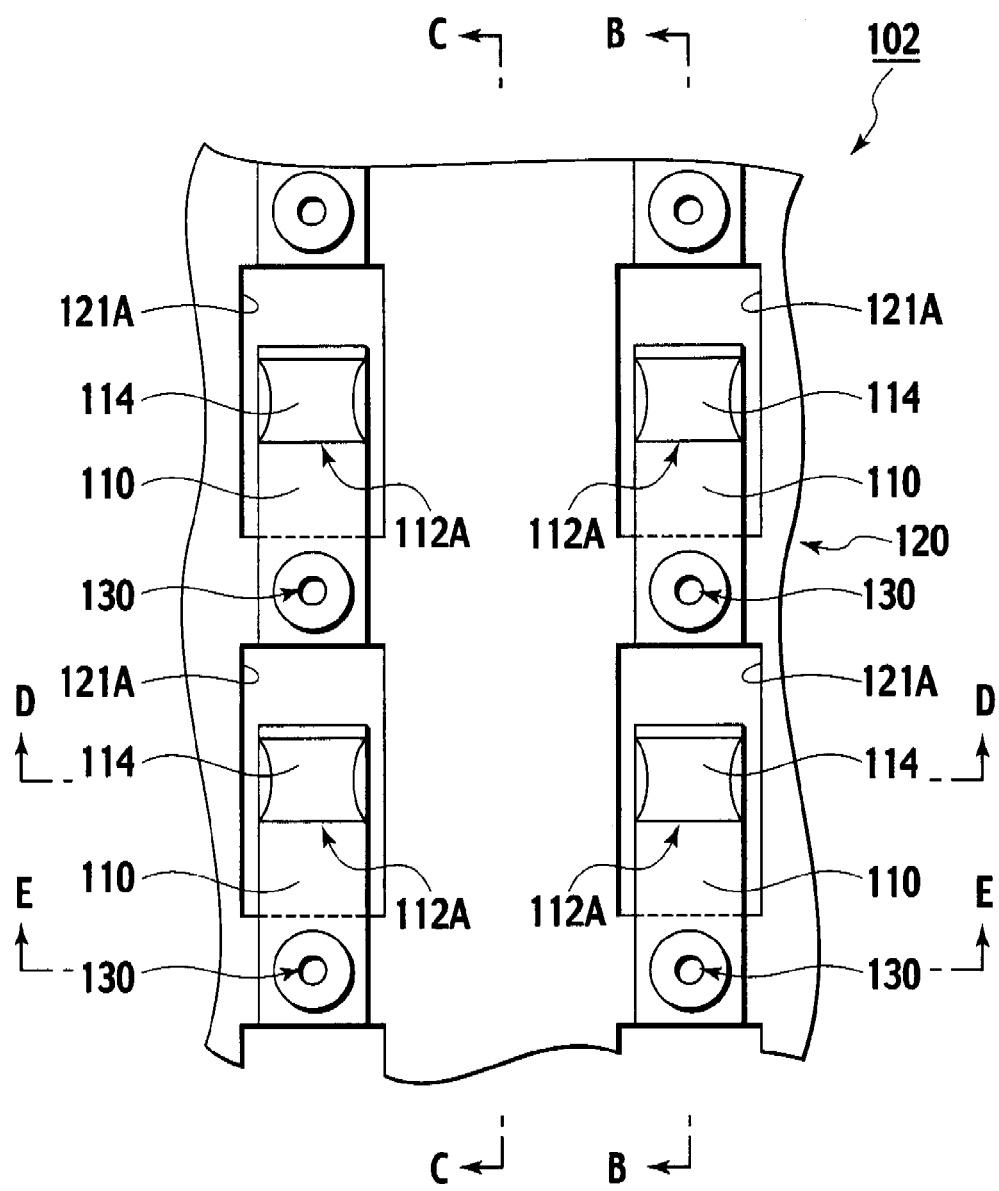
FIG. 23 is a plan view of a chief part of an IC socket according to a fourth embodiment of the present invention.
Figure 24A:
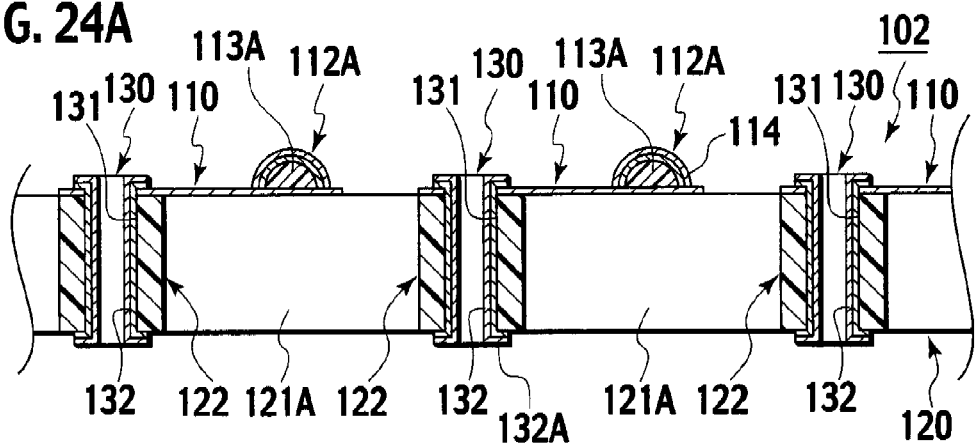
FIG. 24A is a cross-sectional view taken along the B-B line in FIG. 23
Figure 24B:
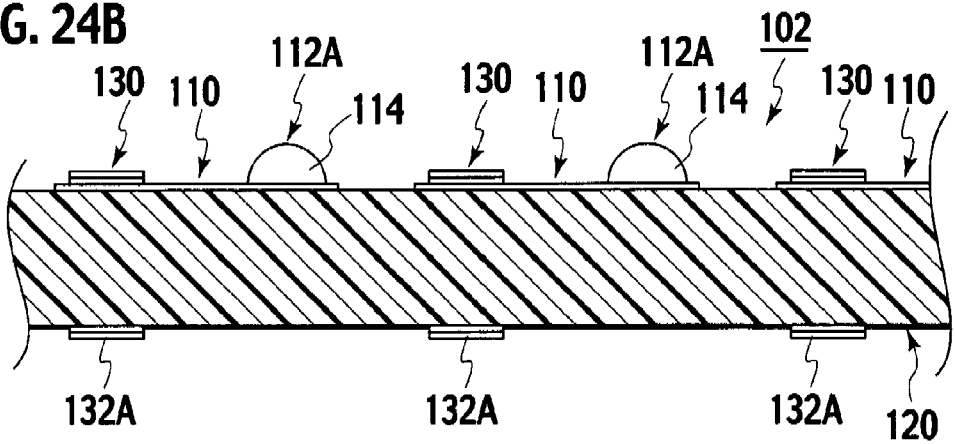
FIG. 24B is a cross-sectional view taken along the C-C line in FIG. 23.
Figure 25A:
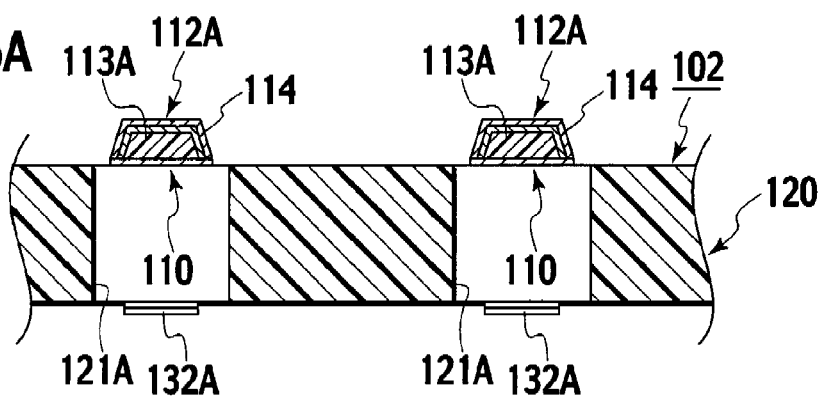
FIG. 25A is a cross-sectional view taken along the D-D line in FIG. 23
Figure 25B:
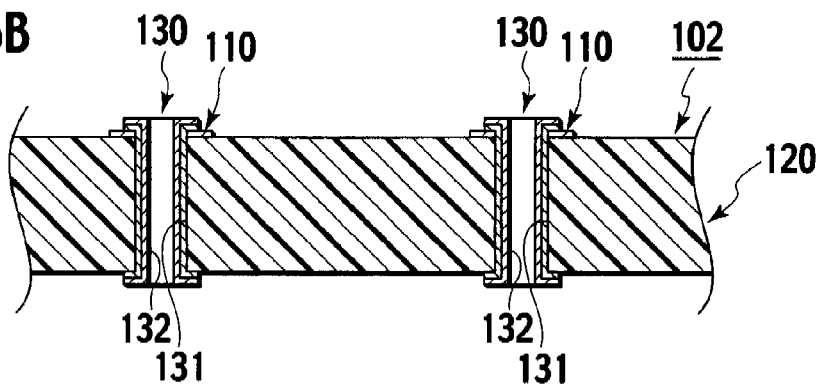
FIG. 25B is a cross-sectional view taken along the E-E line in FIG. 23.

FIG. 23 to FIG. 25B show an IC socket 102 according to a fourth embodiment of the present invention. FIG. 23 is a plan view of a chief part of the IC socket 102, FIG. 24A is a cross-sectional view taken along the B-B line in FIG. 23, FIG. 24B is a cross-sectional view taken along the C-C line in FIG. 23, FIG. 25A is a cross-sectional view taken along the D-D line in FIG. 23, and FIG. 25B is a cross-sectional view taken along the E-E line in FIG. 23. Here, concerning the IC socket 102 of the fourth embodiment, the similar constituents to those in the third embodiment will be designated by the same or similar reference numerals and detailed explanation will be omitted herein.

In the IC socket 102 of this embodiment, the height of the contact fixing portion 122 is set equal to the thickness of the surrounding resin portion. Specifically, the socket base body 120 has a simple structure in which the contact fixing portions 122 do not protrude toward the surface side. Rather, through holes 121A, functioning as rectangular contact housing holes, are simply formed in a predetermined arrangement on the resin constituting a base for the contact pieces 110, and the through holes 131 are formed at the contact fixing portions 122 in the periphery of the through holes 121A. For this reason, it is possible to realize a mold disposed on the back surface side for use in the primary injection molding by only providing simple convex shapes and to realize a mold disposed on the front surface side by only providing concave portions for forming resin bosses 113A.

As described above, it is possible to set the height of the contact fixing portions 122 for fixing the contact pieces 110 by adjusting the thickness of the surrounding resin portion. Accordingly, stroke design for the contact pieces 110 has more flexibility. It is therefore conceivable that the length of the contact piece 110 may be reduced depending on the specifications including a contact pitch or the number of pins required or on a warpage allowance of the IC package.

Moreover, in the IC socket 102 of this embodiment, the width of the through hole 121A located near the contact piece 110 is set substantially larger than the width of the contact piece 110.

Further, in the IC socket 102 of this embodiment, the resin boss 113A provided on the second end of the contact piece 110 is designed substantially in a half-column shape (a vault shape) instead of the semispherical shape.

The IC socket 102 of this embodiment can also exert similar operations and effects to those in the above-described third embodiment. Moreover, a manufacturing method of the IC socket 102 of this embodiment is similar to the manufacturing method of the IC socket 101 of the above-described third embodiment.

Fifth Embodiment

Figure 26:
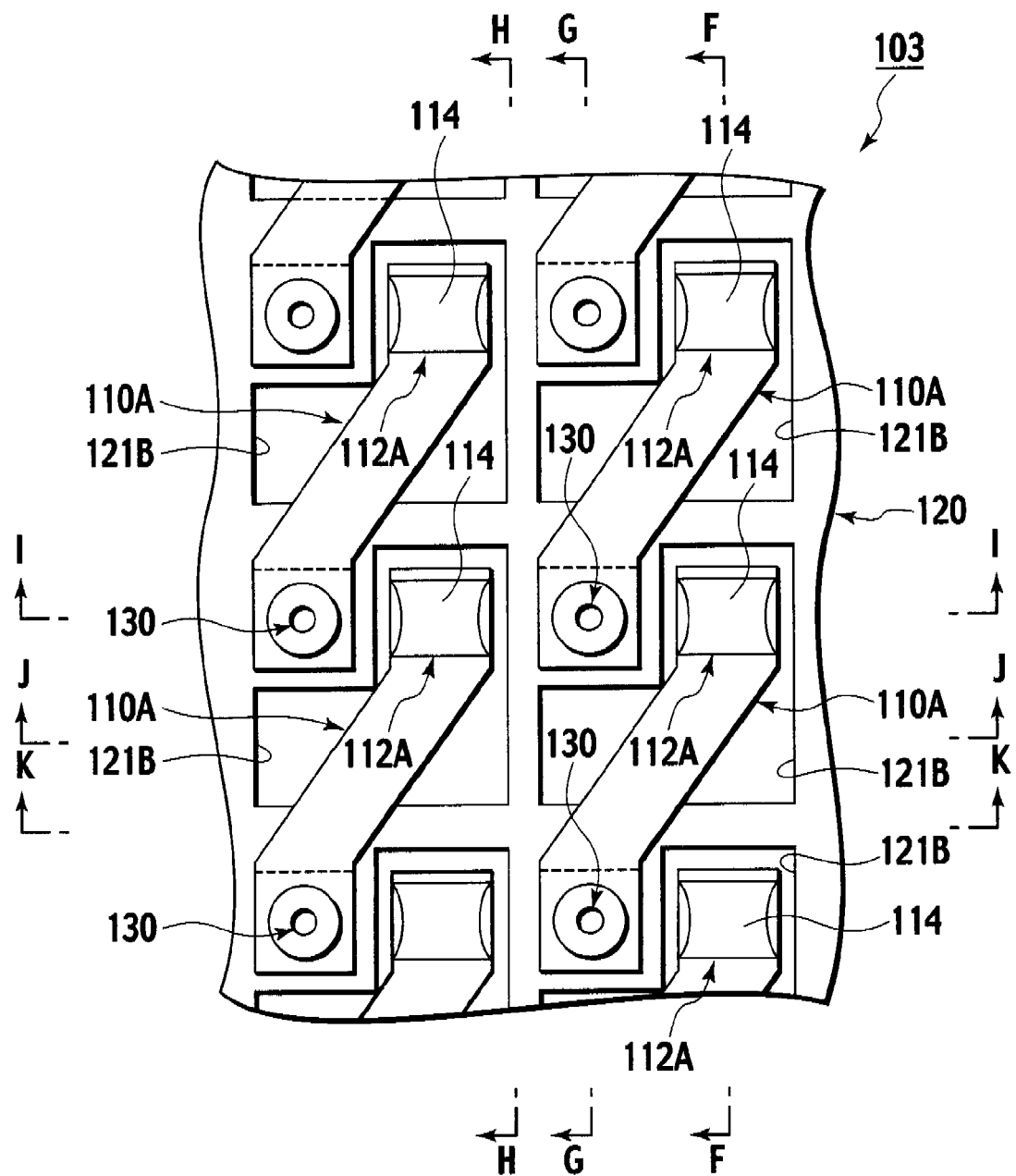
FIG. 26 is a plan view of a chief part of an IC socket according to a fifth embodiment of the present invention.
Figure 27A:
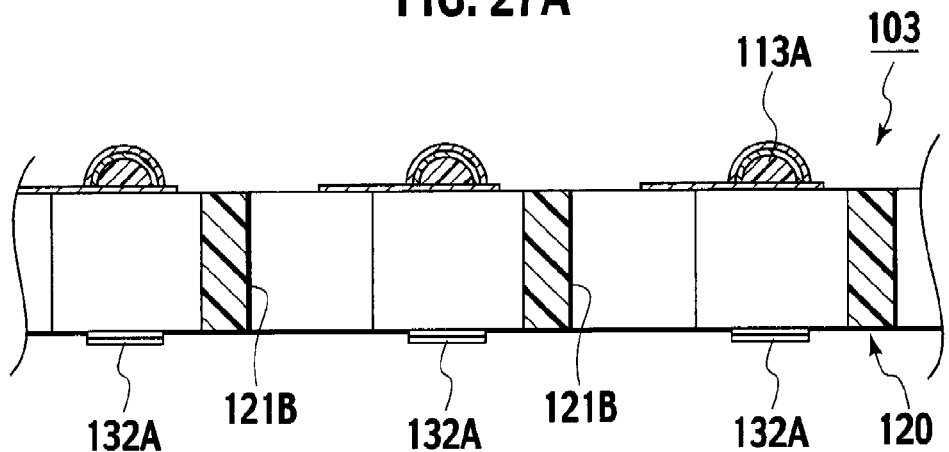
FIG. 27A is a cross-sectional view taken along the F-F line in FIG. 26.
Figure 27B:
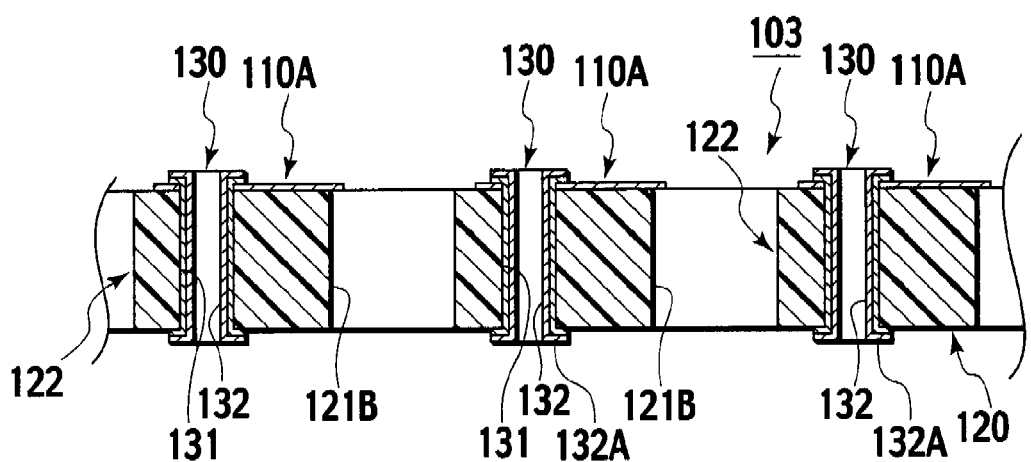
FIG. 27B is a cross-sectional view taken along the G-G line in FIG. 26.
Figure 27C:
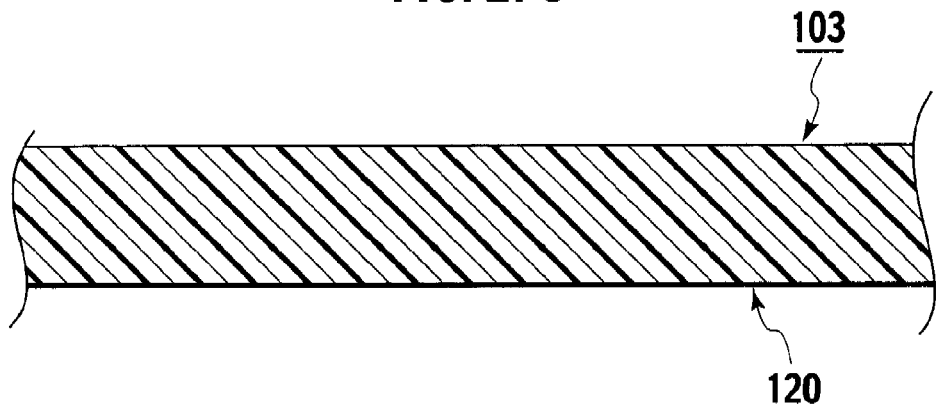
FIG. 27C is a cross-sectional view taken along the H-H line in FIG. 26.
Figure 28A:
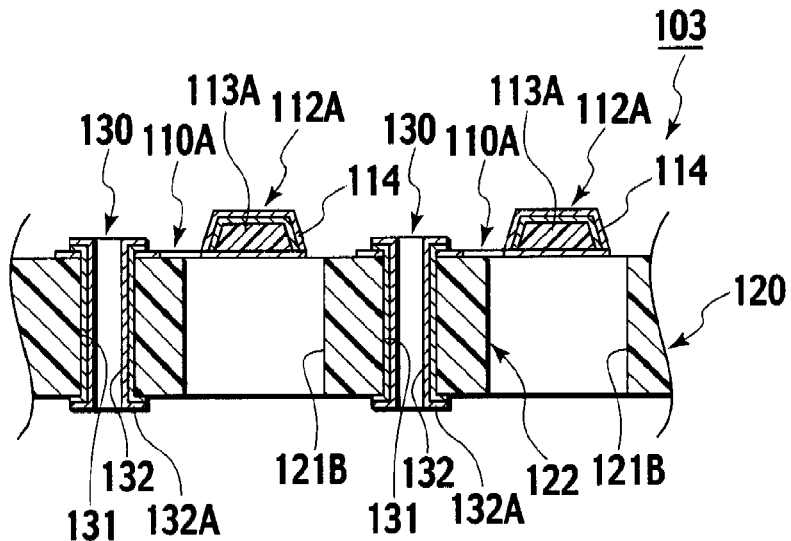
FIG. 28A is a cross-sectional view taken along the I-1 line in FIG. 26.
Figure 28B:
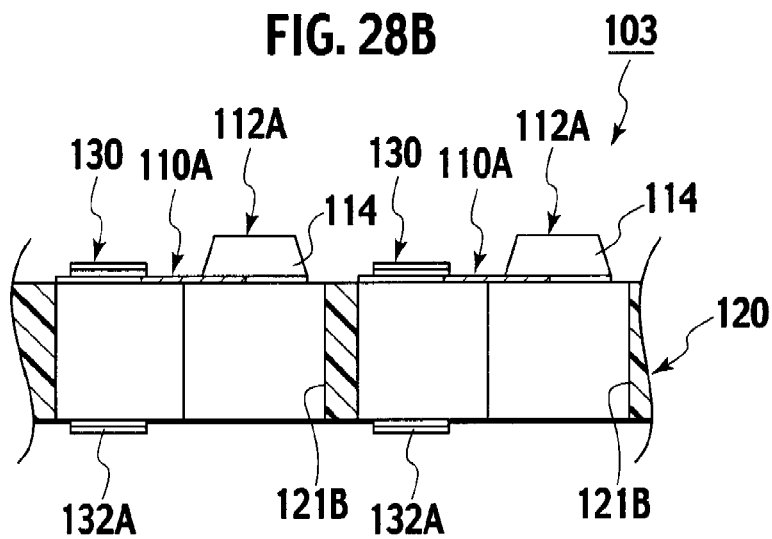
FIG. 28B is a cross-sectional view taken along the J-J line in FIG. 26.
Figure 28C:
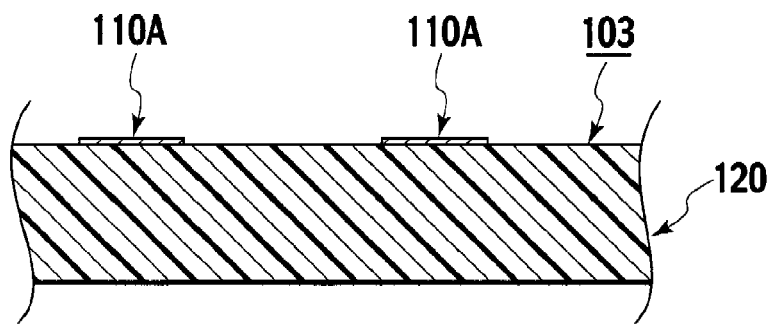
FIG. 28C is a cross-sectional view taken along the K-K line in FIG. 26.

FIG. 26 to FIG. 28C show an IC socket 103 according to a fifth embodiment of the present invention. FIG. 26 is a plan view of a chief part of the IC socket 103, FIG. 27A is a cross-sectional view taken along the F-F line in FIG. 26, FIG. 27B is a cross-sectional view taken along the G-G line in FIG. 26, FIG. 27C is a cross-sectional view taken along the H-H line in FIG. 26, FIG. 28A is a cross-sectional view taken along the I-I line in FIG. 26, FIG. 28B is a cross-sectional view taken along the J-J line in FIG. 26, and FIG. 28C is a cross-sectional view taken along the K-K line in FIG. 26. Here, concerning the IC socket 103 of the fifth embodiment, the similar constituents to those in the IC socket 101 according to the third embodiment or those in the IC socket 102 according to the fourth embodiment described above will be designated by the same or similar reference numerals and detailed explanation will be omitted herein.

In the IC socket 103 of this embodiment, the height of the contact fixing portion 122 is set equal to the thickness of the surrounding resin portion, similar to the IC socket 102 according to the above-described fourth embodiment. Specifically, the socket base body 120 has a simple structure in which the contact fixing portions 122 do not protrude toward the surface side, and through holes 121B functioning as rectangular contact housing holes are simply formed in a predetermined arrangement on the resin constituting a base for contact pieces 110A, and the through holes 131 are formed at the contact fixing portions 122 in the periphery of the through holes 121B. For this reason, it is possible to realize a mold disposed on the back surface side for use in the primary injection molding by only providing simple convex shapes and to realize a mold disposed on the front surface side by only providing concave portions for forming the resin bosses 113A.

The contact piece 110A is formed into a bent shape similar to a crank as shown in FIG. 26 so as to set a long stroke. When designing the contact piece 110A, it is also important to consider relations with the warpage allowance of the package and with the contact pressure along the increase in the number of pins and the finer pitch, and technical difficulty may be increased in the future. Therefore, the above-described structure which can extend a plate spring length of the contact piece 110A or to reduce a load in the stroke by forming this shape is effective as a method of expanding design freedom of springs. The IC socket 103 of this embodiment is able to simplify the shapes of molds necessary for molding while effectively extending the plate spring length in spite of a shorter contact pitch.

For this reason, in the IC socket 103 of this embodiment, the through hole 121B located near the contact piece 110A is located in an appropriate position so as to bend and dispose the contact piece 110A obliquely to secure a longer plate spring length.

Moreover, in the IC socket 103 of this embodiment, the resin boss 113A provided on the second end of the contact piece 110A is also designed substantially in the half-column shape (the vault shape) instead of the semispherical shape.

The IC socket 103 of this embodiment can also exert similar operations and effects to those in the above-described third and fourth embodiments. Moreover, a manufacturing method of the IC socket 103 of this embodiment is similar to the manufacturing method of the IC socket 101 of the above-described third embodiment.

Sixth Embodiment

Figure 29:
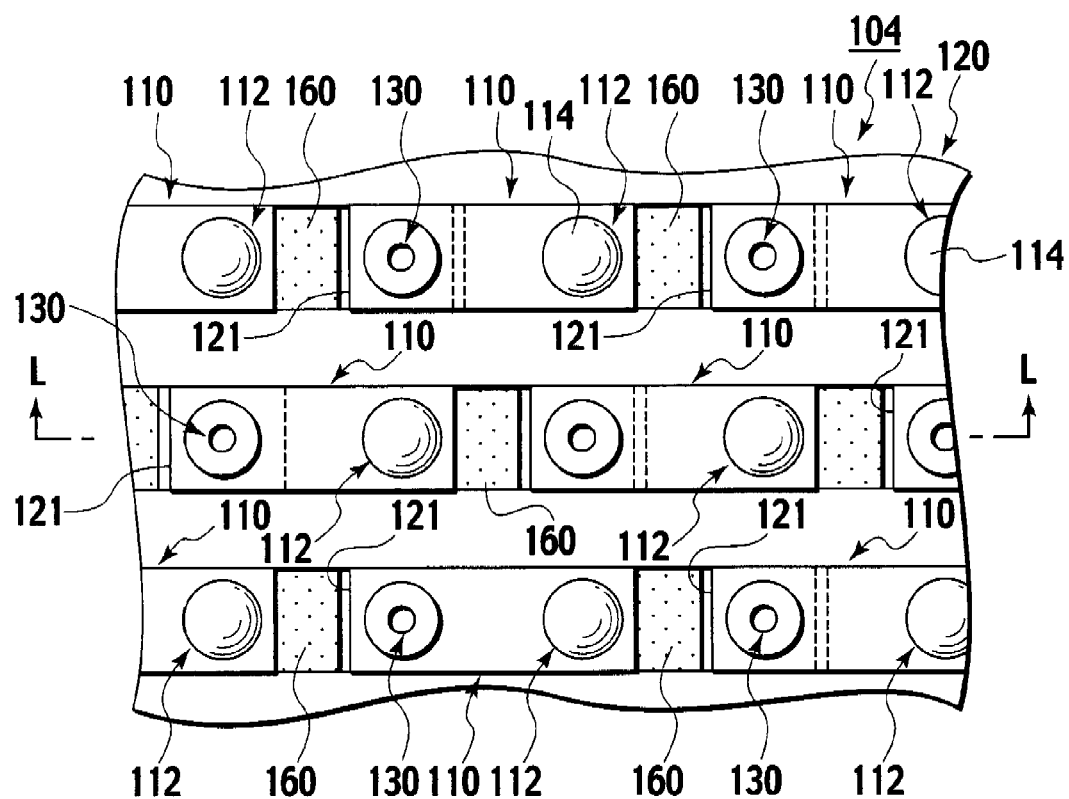
FIG. 29 is a plan view of a chief part of an IC socket according to a sixth embodiment of the present invention.
Figure 30:
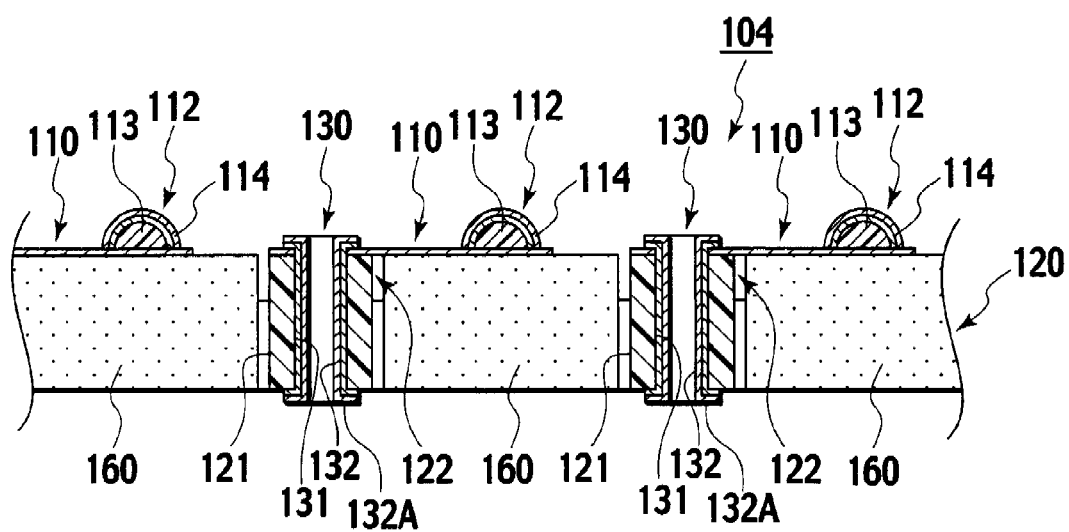
FIG. 30 is a cross-sectional view taken along the L-L line in FIG. 29.

FIG. 29 and FIG. 30 show an IC socket 104 according to a sixth embodiment of the present invention.

In the IC socket 104 of this embodiment as well, the height of the contact fixing portion 122 is set equal to the thickness of the surrounding resin portion. Specifically, the socket base body 120 has a simple structure in which the contact fixing portions 122 do not protrude toward the surface side, through holes 121 functioning as the rectangular contact housing holes are simply formed in a predetermined arrangement on the resin constituting a base for the contact pieces 110, and the through holes are formed at the contact fixing portions 122 in the periphery of the through holes 121. For this reason, it is possible to realize a mold disposed on the back surface side for use in the primary injection molding by only providing simple convex shapes and to realize a mold disposed on the front surface side by only providing concave portions for forming the resin bosses 113.

As described above, it is possible to set the height of the contact fixing portions 122 for fixing the contact pieces 110 by adjusting the thickness of the surrounding resin portion. Accordingly, stroke design for the contact pieces 110 has more flexibility. It is therefore conceivable that the length of the contact piece 110 may be reduced depending on the specifications including the contact pitch or the number of pins required or on the warpage allowance of the IC package.

Moreover, elastomer 160 having elasticity is disposed inside the through hole 121 in this embodiment in order to adjust the contact pressure of the contact piece 110 or to suppress reduction in the contact pressure associated with deformation of the contact piece 110.

The IC socket 104 of this embodiment is also able to exert similar operations and effects to those in the above-described third embodiment. Moreover, a manufacturing method of the IC socket 104 of this embodiment is similar to the manufacturing method of the IC socket 101 of the above-described third embodiment. Nevertheless, the manufacturing method includes an additional process of forming the elastomer 160 inside the through holes 121 after molding the socket base body (the socket housing) 20 as shown in FIG. 30.

Seventh Embodiment

Figure 31:
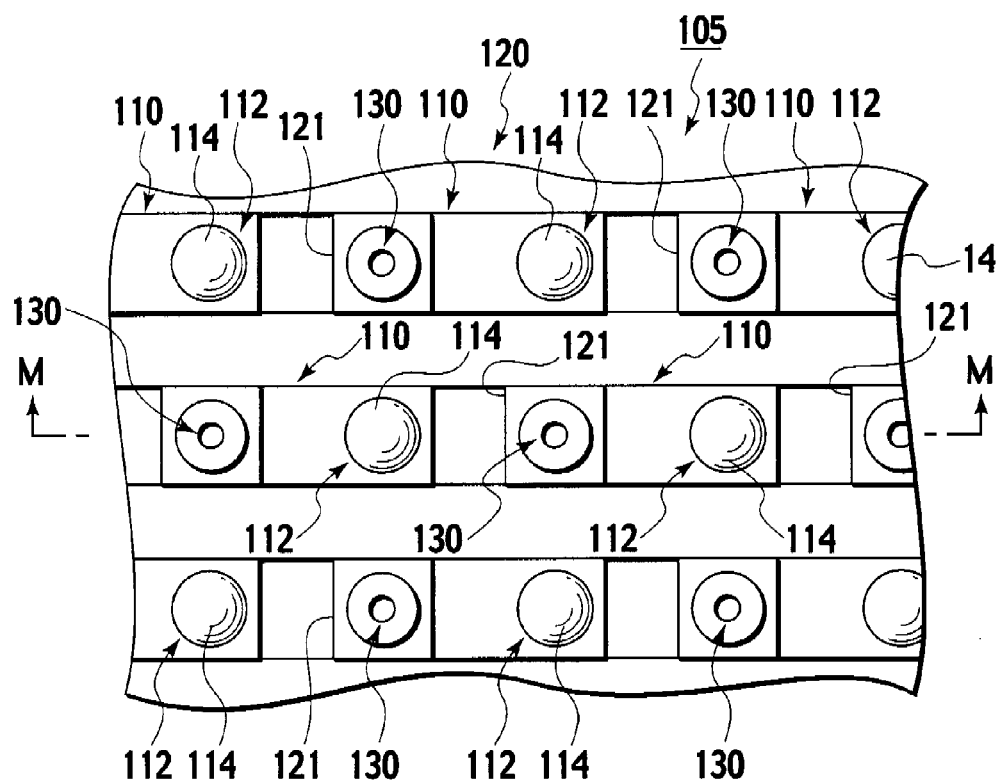
FIG. 31 is a plan view of a chief part of an IC socket according to a seventh embodiment of the present invention.
Figure 32:
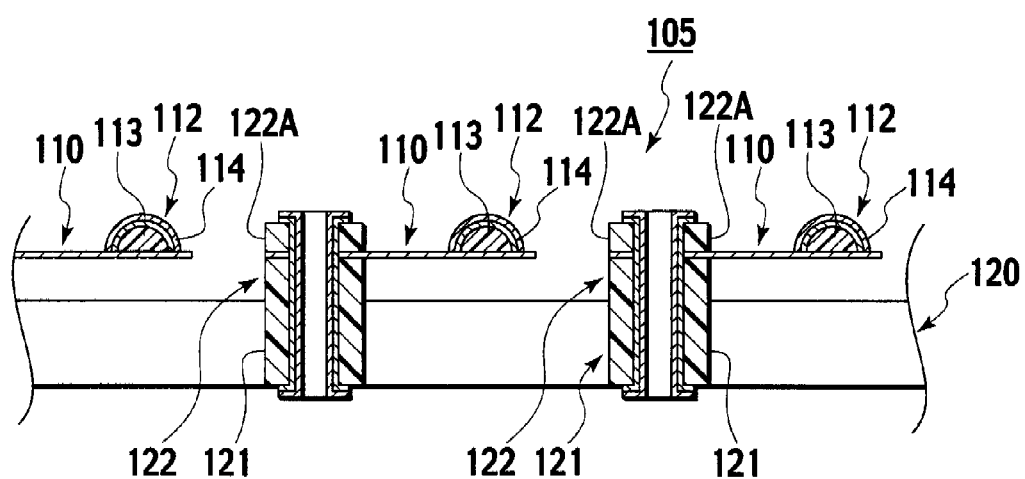
FIG. 32 is a cross-sectional view taken along the M-M line in FIG. 31.

FIG. 31 and FIG. 32 show an IC socket 105 according to a seventh embodiment of the present invention. FIG. 31 is a plan view of a chief part of the IC socket 105 and FIG. 32 is a cross-sectional view taken along the M-M line in FIG. 31.

As shown in FIG. 32, the IC socket 105 of this embodiment has a structure in which a resin layer 122A is also formed on the contact piece 110 when inserting the contact piece 110 to the contact fixing portion 122 so that the contact piece 110 is sandwiched by the resin. For this reason, the contact piece 110 is surely retained by the contact fixing portion 122, thereby improving durability when a load is applied to the contact piece 110.

Other features of this embodiment are similar to those in the respective embodiments described above. Accordingly similar reference numerals are designated in the drawings and detailed explanation will be omitted herein.

Other Embodiment

It is to be understood that the above description and the drawings constituting part of disclosure of the embodiments do not limit the scope of the present invention and that various other embodiments, example, and technical applications become obvious to those skilled in the art from the teachings of this disclosure.

For example, the respective embodiments described above have disclosed the examples of forming the catalyst layers below the plated layers. Instead, it is by all means possible to form the plated layers without providing the catalyst layers.

Moreover, the respective embodiments described above have provided the through holes 121, 121A and 121B functioning as the contact housing holes. Instead, it is also possible to form concave grooves having backs.

Further, the respective embodiments described above are configured to form the resin boss 113 or 113A on the second end of the contact piece 110 and to form the plated layers on the surface of the resin emboss 113 or 113A. Instead, it is by all means possible to form a boss that bulges to the surface side on the second end of the contact piece 110 made of the metal plate by press working.

Various modifications will become possible for those skilled in the art after receiving the teachings of the present disclosure without departing from the scope thereof.

What is claimed is:

1. An IC socket assembly comprising:
   at least one IC socket comprising:
      a socket base body which comprises through hole forming portions including a plurality of through holes which penetrate the socket base, and the socket base body further comprises contact housing holes which penetrate a full thickness of the socket base; and
      contact pieces facing the contact housing holes, the contact pieces including a base portion integrally formed on the through hole forming portions;
      wherein the contact pieces each include a contact boss formed in a bulging manner on a top surface of the contact pieces and near a free end of the contact pieces,
      wherein the socket base body, the contact pieces, and the contact boss are integrally formed and comprise a synthetic resin having an electrical insulating property, and
      wherein plated layers are formed on an inner wall of the through holes, on top and bottom surfaces of the through hole forming portions, and on top surfaces of the contact pieces, each including the contact boss.

2. The IC socket assembly of claim 1, wherein a resilient member is housed in the contact housing holes.

3. The IC socket assembly of claim 2, wherein the resilient member comprises a material having resistance against reflow.

4. The IC socket assembly of claim 1, wherein the plated layer on the lower surface of the through hole forming portions includes a solder ball.

5. The IC socket assembly of claim 1, wherein the at least one IC socket comprises a pair of IC sockets;
   wherein the pair of IC sockets are attached to each other with the bottom surfaces of the IC sockets being in contact with each other, and
   the plated layers on the bottom surfaces of the through hole forming portions are solder bonded to each other.

6. An IC socket assembly according to claim 1, wherein each through hole is associated with a through hole forming portion and a contact piece and the plated layer is formed continuously from the inner wall of the through holes, the top and bottom surfaces of the through hole forming portion, and on the surface of the contact piece of associated through holes, through hole forming portions and contact pieces.

7. A manufacturing method of an IC socket comprising the steps of:
   integrally forming, by use of synthetic resin, a socket base body which includes through hole forming portions having a plurality of through holes which penetrate the socket base, the socket base body further comprising contact housing holes penetrating the plate-like socket base;
   forming a plate-like contact pieces which face the through holes and each comprising a base portion integrally formed on a side wall portion on a surface of one of the through hole forming portions; and
   forming a plated layer continuously on an inner wall of the through hole, on front and back surfaces of the through hole forming portion, and on a surface of the contact piece.

8. An IC socket comprising:
   a socket base body including a plurality of contact housing holes formed from a front surface side, to which an IC package is to be attached, toward a back surface side, and contact fixing portions provided in a vicinity of the respective contact housing holes;
   contact pieces each having a first end fixed to a front surface side of a corresponding one of the contact fixing portions with the contact piece facing the contact housing hole; and
   through hole portions each configured to bring the contact piece into conduction to the back surface side of the socket base body by penetrating the first end of the contact piece and the contact fixing portion,
   wherein the socket base body comprises a synthetic resin having an electrical insulating property,
   wherein a contact boss is formed on a second end of the contact piece so as to bulge toward an IC package to be attached to the contact piece, and wherein the contact boss includes a resin boss provided on the second end of the contact piece and having a surface covered with a metal layer.

9. The IC socket of claim 8, wherein the contact housing hole penetrates the socket body in a front-to-back direction.

10. The IC socket of claim 8, wherein a resilient member is housed in the contact housing hole.

11. The IC socket of claim 8, wherein a second end of the contact piece is provided so as not to overlap another contact fixing portion adjacent to the contact fixing portion to which the contact piece is fixed.

12. The IC socket of claim 11, wherein the contact piece has a planar shape which is bent into a crank fashion.

13. The IC socket of claim 8, wherein a solder ball is provided on the through hole portion exposed to the back surface side of the socket base body.

14. An IC socket complex comprising:
    a pair of IC sockets, each of the IC sockets including:
        a socket base body including a plurality of contact housing holes formed from a front surface side, to which an IC package is to be attached, toward a back surface side, and contact fixing portions provided in a vicinity of the respective contact housing holes;
        contact pieces each having a first end fixed to a front surface side of a corresponding one of the contact fixing portions with the contact piece facing the contact housing hole; and
        through hole portions each configured to bring the contact piece into conduction to the back surface side of the socket base body by penetrating the first end of the contact piece and the contact fixing portion,
        wherein the socket base body comprises a synthetic resin having an electrical insulating property,
        wherein a contact boss is formed on a second end of the contact piece so as to bulge toward an IC package to be attached to the contact piece, and
        wherein the contact boss includes a resin boss provided on the second end of the contact piece and having a surface covered with a metal layer
        wherein the pair of IC sockets are attached to each other with back surfaces of the IC sockets being in contact with each other, and
        wherein plated layers on back surfaces of through hole forming portions are solder bonded to each other.

15. A manufacturing method of an IC socket comprising the steps of:
    forming a plurality of contact pieces each including an opening for a through hole on a first end of the contact piece, by processing a metal plate;
    forming a plate-like socket base body having a plurality of contact housing holes from a front surface side, to which an IC package is attached, toward a back surface side, having the first end of each of the contact pieces fixed to a corresponding one of the contact fixing portions around the contact housing holes, and having through holes communicated with the respective openings for through holes, by setting the contact pieces on a mold for injection molding and performing injection molding of the plate-like socket base body;
    setting the socket base body on a mold so as to expose the through holes and part of the contact pieces; and
    forming a plated layer on the through holes and the exposed part of the contact pieces.

16. The manufacturing method of an IC socket of claim 15, wherein the contact housing holes penetrate the socket base body in a front-to-back direction.

17. The manufacturing method of an IC socket of claim 15,
    wherein a resin boss is formed in a bulging manner on a surface on a second end of each of the contact pieces in the injection molding step, and
    a plated layer for sealing the resin boss is formed on the second end of the contact piece in the plating step.

18. An IC socket assembly comprising:
    a pair of IC sockets, each of the IC sockets comprising:
        a socket base body which comprises through hole forming portions including a plurality of through holes which penetrate the socket base, and the socket base body further comprises contact housing holes which penetrate a full thickness of the socket base; and
        contact pieces facing the contact housing holes, the contact pieces including a base portion integrally formed on the through hole forming portions;
        wherein plated layers are formed on an inner wall of the through holes, on top and bottom surfaces of the through hole forming portions, and on surfaces of the contact pieces,
        wherein the socket base body is integrally formed and comprises a synthetic resin having an electrical insulating property, and
        wherein the contact pieces each include a contact boss formed in a bulging manner on the surface of the contact pieces near a free end of the contact pieces.

* * * * *